United States Patent
Leobandung

(10) Patent No.: US 11,835,572 B2
(45) Date of Patent: Dec. 5, 2023

(54) USAGE METERING BY BIAS TEMPERATURE INSTABILITY

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 429 days.

(21) Appl. No.: 17/223,543

(22) Filed: Apr. 6, 2021

(65) Prior Publication Data

US 2022/0317177 A1    Oct. 6, 2022

(51) Int. Cl.
*G01R 31/28*    (2006.01)
*H01L 23/528*    (2006.01)
(Continued)

(52) U.S. Cl.
CPC ...... *G01R 31/2851* (2013.01); *H01L 21/0259* (2013.01); *H01L 21/02532* (2013.01);
(Continued)

(58) Field of Classification Search
CPC ............ G01R 31/2851; G01R 31/2884; H01L 21/02532; H01L 21/0259; H01L 21/823412; H01L 21/823418; H01L 21/823475; H01L 23/5286; H01L 27/088; H01L 29/0665; H01L 29/41733;
(Continued)

(56) References Cited

U.S. PATENT DOCUMENTS

| | | | | |
|---|---|---|---|---|
| 5,497,348 A | * | 3/1996 | Tsay | G11C 29/50 365/201 |
| 6,060,945 A | * | 5/2000 | Tsay | G05F 1/465 327/543 |

(Continued)

OTHER PUBLICATIONS

John Keane et al., "An On-Chip NBTI Sensor for Measuring pMOS Threshold Voltage Degradation," IEEE transactions on very large scale integration (VLSI) systems, vol. 18, No. 6, Jun. 2010, pp. 947-956 (first published Oct. 2009).

(Continued)

*Primary Examiner* — Jermele M Hollington
*Assistant Examiner* — Zannatul Ferdous
(74) *Attorney, Agent, or Firm* — Samuel Waldbaum; Michael J. Chang, LLC

(57) ABSTRACT

Techniques for usage metering by bias temperature instability with differential sensing on pairs of matching transistors are provided. In one aspect, a usage metering device includes: at least one metering circuit on a chip, the at least one metering circuit having a pair of matching transistors, and a differential current sense circuit connected to the pair of matching transistors, wherein the pair of matching transistors includes a reference transistor which is unused during regular operation of the chip, and a stressed transistor that is on continuously during the regular operation of the chip, and wherein the differential current sense circuit determines a Vt difference between the reference transistor and the stressed transistor. A method for usage metering and a method of forming a usage metering device are also provided.

20 Claims, 24 Drawing Sheets

(51) Int. Cl.
  *H01L 27/088* (2006.01)
  *H01L 29/06* (2006.01)
  *H01L 29/417* (2006.01)
  *H01L 29/423* (2006.01)
  *H01L 29/786* (2006.01)
  *H01L 21/02* (2006.01)
  *H01L 21/8234* (2006.01)
  *H01L 29/66* (2006.01)

(52) U.S. Cl.
  CPC ......... *H01L 21/823412* (2013.01); *H01L 21/823418* (2013.01); *H01L 21/823475* (2013.01); *H01L 23/5286* (2013.01); *H01L 27/088* (2013.01); *H01L 29/0665* (2013.01); *H01L 29/41733* (2013.01); *H01L 29/42392* (2013.01); *H01L 29/66545* (2013.01); *H01L 29/66553* (2013.01); *H01L 29/66742* (2013.01); *H01L 29/78618* (2013.01); *H01L 29/78696* (2013.01)

(58) Field of Classification Search
  CPC ......... H01L 29/42392; H01L 29/66545; H01L 29/66553; H01L 29/66439; H01L 22/34; H01L 27/0688; H01L 29/165; H01L 29/6653; H01L 29/775; H01L 29/7848; B82Y 10/00; G06F 11/3058
  See application file for complete search history.

(56) References Cited

U.S. PATENT DOCUMENTS

| | | | |
|---|---|---|---|
| 6,462,584 B1 * | 10/2002 | Proebsting | G11C 7/22 365/204 |
| 6,731,179 B2 | 5/2004 | Abadeer et al. | |
| 6,903,564 B1 | 6/2005 | Suzuki | |
| 8,081,003 B2 | 12/2011 | Pacha et al. | |
| 8,260,708 B2 | 9/2012 | Potkonjak | |
| 9,344,358 B2 | 5/2016 | Bhardwaj et al. | |
| 9,513,329 B2 | 12/2016 | Potkonjak | |
| 9,606,172 B2 | 3/2017 | Chen et al. | |
| 10,234,487 B2 * | 3/2019 | Nizza | G01R 19/0092 |
| 2006/0049886 A1 | 3/2006 | Agostinelli, Jr. et al. | |
| 2017/0192040 A1 * | 7/2017 | Shuvalov | G01R 19/0092 |

OTHER PUBLICATIONS

Tae-Hyoung Kim et al., "Silicon Odometer: An On-Chip Reliability Monitor for Measuring Frequency Degradation of Digital Circuits," IEEE Journal of Solid-State Circuits, vol. 43, No. 4, Apr. 2008, pp. 874-880.

Tomoaki Kubo et al., "An Outlier Removal Method for SPC in Semiconductor Manufacturing," SICE Journal of Control, Measurement, and System Integration, vol. 3, No. 4, pp. 292-298 (Jul. 2010).

* cited by examiner

US 11,835,572 B2

USAGE METERING BY BIAS TEMPERATURE INSTABILITY

FIELD OF THE INVENTION

The present invention relates to integrated circuit usage metering, and more particularly, to techniques for usage metering by bias temperature instability with differential sensing on pairs of matching transistors.

BACKGROUND OF THE INVENTION

As its name implies, usage metering can be employed to monitor or meter the usage of an integrated circuit in order to show the 'age' of the integrated circuit. With use, integrated circuits degrade over time. This 'aging' affects the device performance.

Being able to ascertain the age of an integrated circuit has some notable applications and benefits. For instance, an unsuspecting consumer might purchase chips recycled from an old system thinking that they are new. However, such chips may be past their reliability window and thus prone to failure after a short period of time.

Therefore, techniques for accurately and easily determining the age of an integrated circuit through usage metering would be desirable.

SUMMARY OF THE INVENTION

The present invention provides techniques for usage metering by bias temperature instability with differential sensing on pairs of matching transistors. In one aspect of the invention, a usage metering device is provided. The usage metering device includes: at least one metering circuit on a chip, the at least one metering circuit having a pair of matching transistors, and a differential current sense circuit connected to the pair of matching transistors, wherein the pair of matching transistors includes a reference transistor which is unused during regular operation of the chip, and a stressed transistor that is on continuously during the regular operation of the chip, and wherein the differential current sense circuit determines a threshold voltage (Vt) difference between the reference transistor and the stressed transistor.

In another aspect of the invention, a method for usage metering is provided. The method includes: providing a usage metering device including at least one metering circuit on a chip, the at least one metering circuit having a pair of matching transistors, and a differential current sense circuit connected to the pair of matching transistors, wherein the pair of matching transistors includes a reference transistor which is unused during regular operation of the chip, and a stressed transistor that is on continuously during the regular operation of the chip; and determining a Vt difference between the reference transistor and the stressed transistor using the differential current sense circuit.

In yet another aspect of the invention, a method of forming a usage metering device is provided. The method includes: forming at least one metering circuit on a chip having a pair of matching transistors, wherein the pair of matching transistors includes a reference transistor which is unused during regular operation of the chip, and a stressed transistor that is on continuously during the regular operation of the chip; and connecting the pair of matching transistors to a differential current sense circuit, wherein the differential current sense circuit determines a Vt difference between the reference transistor and the stressed transistor.

A more complete understanding of the present invention, as well as further features and advantages of the present invention, will be obtained by reference to the following detailed description and drawings.

DETAILED DESCRIPTION OF PREFERRED EMBODIMENTS

Figure 1:
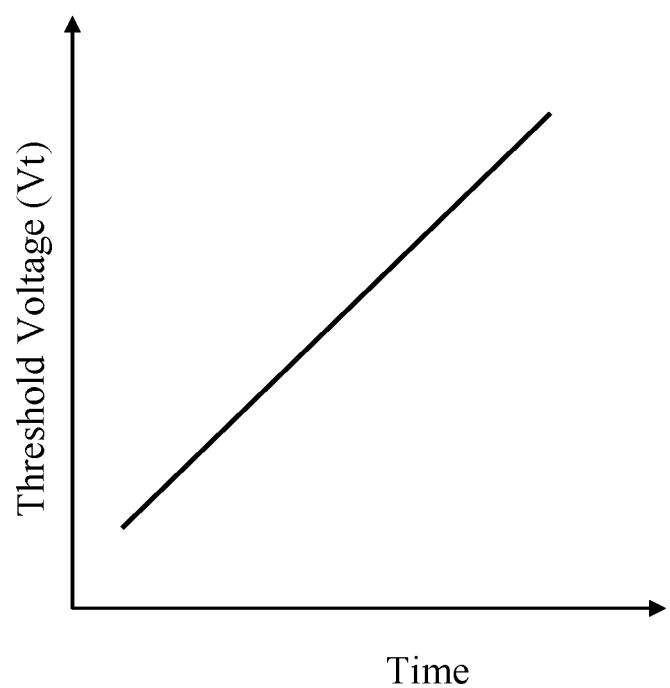
FIG. 1 is a diagram illustrating that a positive gate bias results in an increase in threshold voltage (Vt) over time according to an embodiment of the present invention.

As provided above, integrated circuits degrade over time with use thereby affecting device performance. Usage metering can be employed to monitor the 'age' of an integrated circuit. For instance, integrated circuits can include active devices such as field-effect transistors (FETs). As FETs age through use, more charge gets trapped in the gate dielectric which builds up and leads to a shift in the threshold voltage or Vt. This degradation is referred to as bias temperature instability or BTI. As shown for instance in FIG. 1, as time progresses, a positive gate bias results in an increase in threshold voltage or Vt on an n-channel FET (NFET), while a negative gate bias results in an increase in Vt on a p-channel FET (PFET).

Observing the BTI alone, however, cannot serve as an accurate metric of age. This is because initial Vt varies and BTI will fluctuate depending on the particular FET circuit(s) employed in the design. Furthermore, such a measurement has no absolute starting value.

Advantageously, the present techniques leverage BTI degradation as a metric of age in a controlled manner with differential sensing on a pair of matching transistors on a chip, one (first) transistor being a reference device and the other (second) transistor being a stressed device. The reference device is not used during normal, regular operation of the chip and thus does not experience aging through BTI degradation. On the other hand, the stressed device is on continuously during regular use of the chip and experiences degradation through normal use. By 'matching transistors' it is meant that the first transistor/reference device and the second transistor/stressed device have an identical structure and configuration as one another. An exemplary methodology for co-fabricating identical pairs of reference and stressed transistors is described in detail below. Given this pair of matching transistors, one can then use the reference transistor from the pair as a standard against which to compare the performance of the stressed transistor of the pair in order to determine and monitor the age of the chip.

Figure 2:
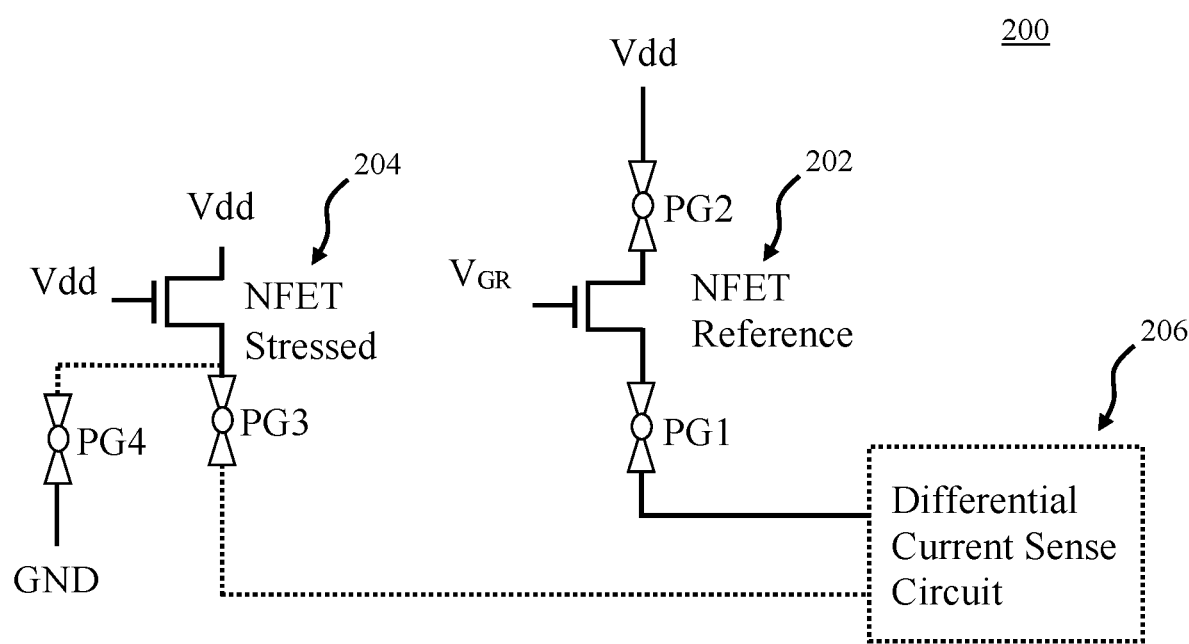
FIG. 2 is a diagram illustrating an exemplary metering circuit according to an embodiment of the present invention.

For instance, referring to FIG. 2, a circuit diagram is provided of a metering circuit 200 that may be employed in accordance with the present techniques. As shown in FIG. 2, metering circuit 200 includes a pair of matching/identical reference and stressed transistors, i.e., reference transistor 202 and stressed transistor 204. The reference transistor 202 and stressed transistor 204 are each connected to a differential current sense circuit 206 which determines the Vt difference between the reference transistor 202 and the stressed transistor 204. By way of example only, differential current sense circuit 206 can include, but is not limited to, any type of differential current sensing circuit known in the art. As provided above, the stressed transistor 204 is on continuously during use of the chip and thus experiences a shift in Vt over time due to BTI degradation. No such Vt shift occurs in the reference transistor 202 since it is not used during regular operation of the chip and thus does not experience BTI degradation. As such, by using differential current sense circuit 206 to compare the output from the reference transistor 202 and the stressed transistor 204, one can make an accurate determination of the age of the chip.

As shown in FIG. 2, pass gates (i.e., PG1, PG2, PG3 and PG4) are implemented to 1) turn on only the stressed transistor 204 during normal operation of the chip (and thereby prevent any BTI degradation of the reference transistor 202), and 2) connect the reference transistor 202 and the stressed transistor 204 to current sense circuit 206 during metering read out. A pass gate is an analog switch in an electronic circuit that will selectively block or pass a signal from an input to an output of the circuit.

Specifically, first/second pass gates PG1 and PG2 connect the reference transistor 202 to the differential current sense circuit 206 and to an applied voltage (Vdd), respectively. Third/fourth pass gates PG3 and PG4 connect the stressed transistor 204 to the differential current sense circuit 206 and to ground (GND), respectively.

Figure 3:
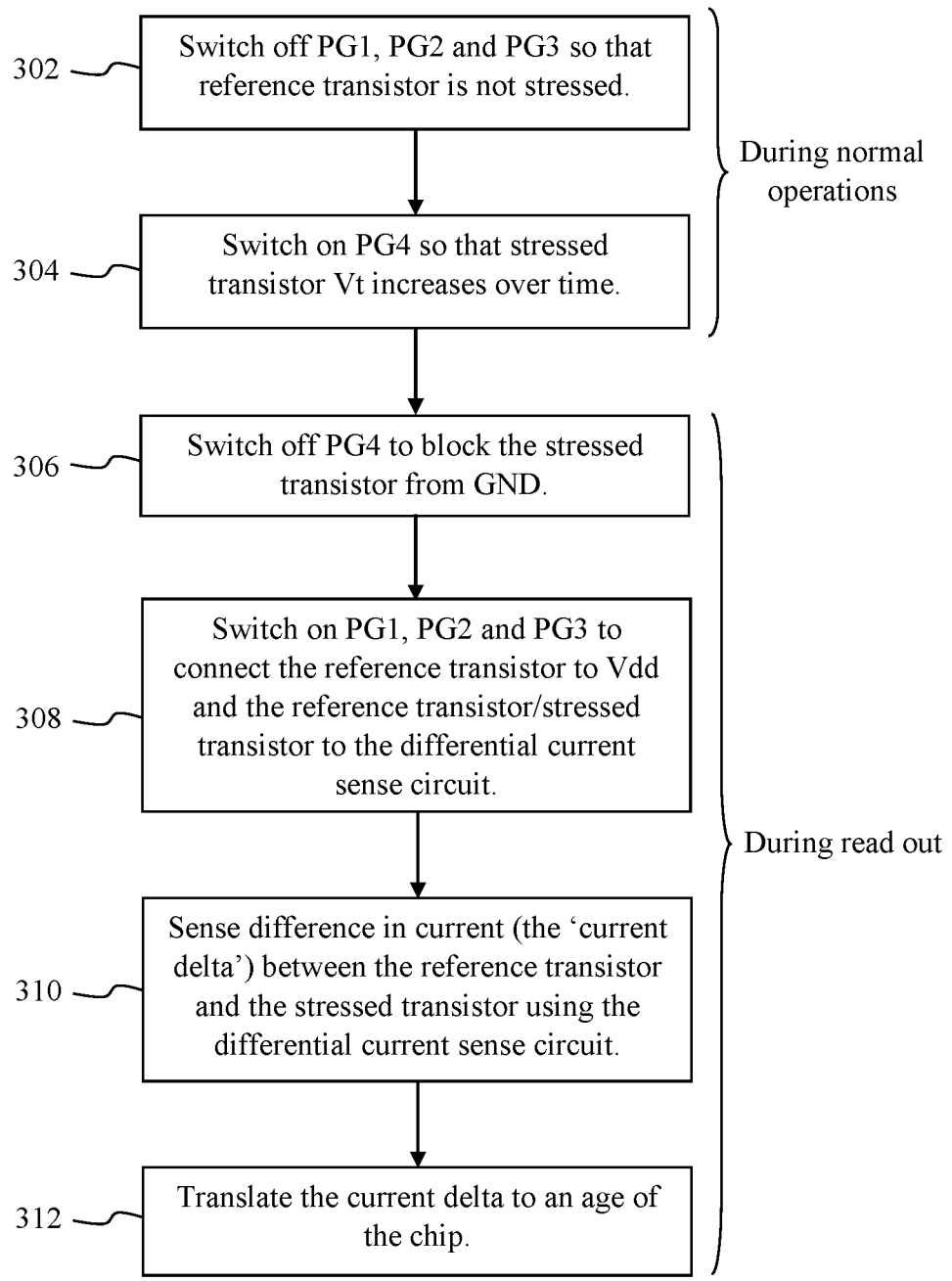
FIG. 3 is a diagram illustrating an exemplary methodology for operating the metering circuit of FIG. 2 according to an embodiment of the present invention.

For instance, FIG. 3 is a diagram illustrating an exemplary methodology 300 for operating metering circuit 200. During regular, normal operation of the chip, gate voltage ($V_G$) is low (e.g., $V_G$ is at 0 volts (V)) and, in step 302, pass gates PG1, PG2 and PG3 are switched off so that the reference transistor 202 is not stressed. Namely, referring briefly back to FIG. 2, pass gates PG2 and PG1 being switched off blocks the reference transistor 202 from applied voltage (Vdd) and differential current sense circuit 206, respectively. Pass gate PG3 being switched off blocks the stressed transistor 204 from the differential current sense circuit 206. The terms 'regular/normal operation' refer generally to all operations of the chip other than the metering read out operations (see below). As will be described in detail below, it is only during metering read out that the reference transistors 202 are switched on. For the remainder of the time, during regular operations, the reference transistors 202 are unused and in place to serve as an unstressed point of comparison during read out.

In step 304, pass gate PG4 is switched on so that transistor 204 is stressed such that the Vt of (stressed) transistor 204 increases as a function of time. Pass gate PG4 being switched on connects stressed transistor 204 to ground (GND) during normal operation. See FIG. 2.

During metering read out, $V_G$ is high ($V_G$=Vdd) and, in step 306, pass gate PG4 is switched off. Pass gate PG4 being switched off blocks stressed transistor 204 from GND during metering read out. See FIG. 2. In step 308, pass gates PG1, PG2 and PG3 are switched on. Pass gates PG2 and PG1 being switched on connects the reference transistor 202 to Vdd and differential current sense circuit 206, respectively. Pass gate PG3 being switched on connects the stressed transistor 204 to the differential current sense circuit 206. $V_{GR}$ denotes the gate voltage for the reference transistor 202.

The differential current sense circuit 206 is now connected to both reference transistor 202 and the stressed transistor 204. In step 310, differential current sense circuit 206 is used to sense the difference in current (i.e., the 'current delta') between the reference transistor 202 and the stressed transistor 204. In step 312, the difference in current (i.e., the 'current delta') between the reference transistor 202 and the stressed transistor 204 from step 310 is translated to an age of the chip. For instance, by way of example only, 'current delta' values corresponding to metering circuits of known ages (having known durations of normal use) can be stored in a look-up table. The 'current delta' from step 310 can then be translated into a chip age from the look-up table data.

Figure 4:
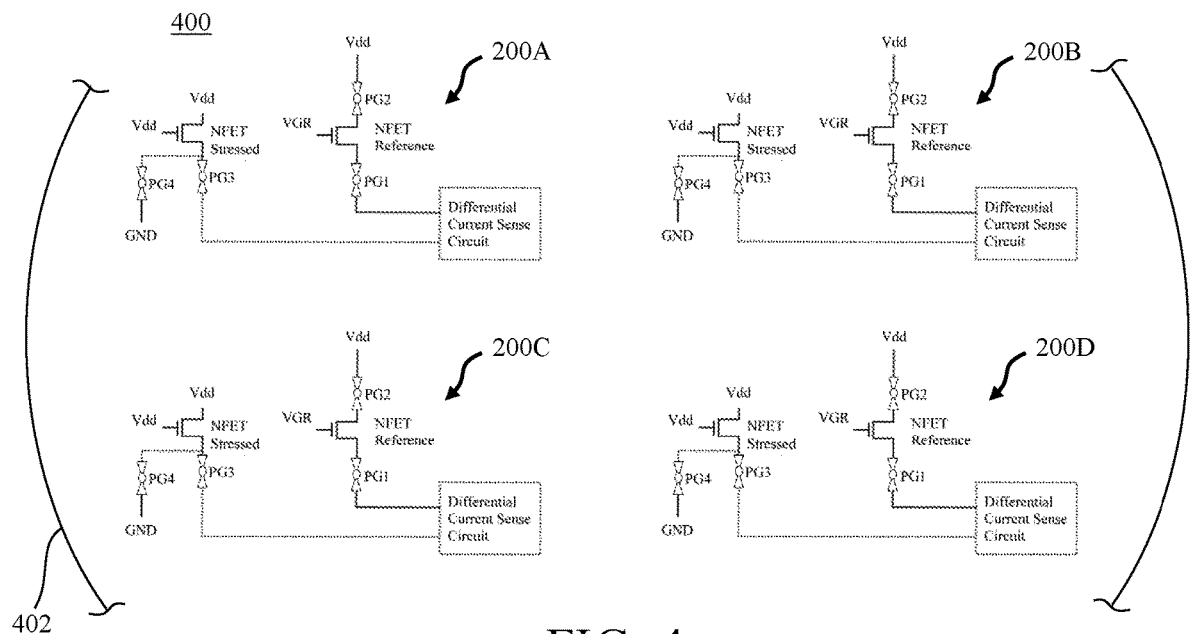
FIG. 4 is a diagram illustrating an exemplary usage metering device design having multiple metering circuits on a chip according to an embodiment of the present invention.

While the output from a single pair of identical reference and stressed transistors can be analyzed to determine the age of the chip, it is preferable to employ multiple metering circuits 200 in order to average out any BTI variations amongst the metering circuits. Thus, according to an exemplary embodiment, a usage metering device design 400 having multiple metering circuits 200A, 200B, 200C, 200D, etc. on a chip 402 is used. See FIG. 4. Each of metering circuits 200A, 200B, 200C, 200D, etc. has the same configuration as metering circuit 200 described in conjunction with the description of FIG. 2 above. Namely, as shown in FIG. 4, each of metering circuits 200A, 200B, 200C, 200D, etc. includes a pair of identical reference and stressed transistors connected to a differential current sense circuit which, as described above, is used to determine the Vt difference between the reference transistor and the stressed transistor.

Further, each of metering circuits 200A, 200B, 200C, 200D, etc. is operated in the same manner as described in conjunction with the description of methodology 300 of FIG. 3 above. Namely, pass gates (i.e., PG1, PG2, PG3 and PG4) are implemented to 1) turn on only the stressed transistor during normal operation of the chip (and thereby prevent any BTI degradation of the reference transistor), and 2) connect the reference transistor and the stressed transistor to the current sense circuit during metering read out.

In the case of usage metering device design 400, read out values will be obtained from multiple metering circuits, i.e., metering circuits 200A, 200B, 200C, 200D, etc. In that case, the data from the metering circuits 200A, 200B, 200C, 200D, etc. can be collected, processed, and analyzed using a variety of statistical methods. For instance, by way of example only, outliers can be identified and removed from the data set using a method such as Effective Standard Deviation based Outlier Detection (ESOD) described in Tomoaki Kubo et al., "An Outlier Removal Method for SPC in Semiconductor Manufacturing," SICE Journal of Control, Measurement, and System Integration, Vol. 3, No. 4, pp. 292-298 (July 2010).

A notable challenge associated with implementing the present techniques is in providing pairs of identical reference and stressed transistors for use in the present metering circuit design. Namely, separately fabricating individual transistors would invariably introduce unwanted variations both between the reference and stressed transistors in a given pair, as well as from one pair to another. Thus, according to an exemplary embodiment, a process is employed in accordance with the present techniques whereby the reference and stressed transistors are co-fabricated on the chip to ensure that the transistors in each pair of matched reference and stressed transistors are identical to one another or as similar to one another as possible. More specifically, in this exemplary embodiment, a stack field-effect transistor (FET) design is employed to ensure matching. However, it is notable that the present usage metering techniques can be employed using matched reference and stressed transistors of any configuration, that are fabricated using any suitable process.

As highlighted above, the process will generally involve first forming at least one pair of matching transistors including a reference transistor and a stressed transistor. In this example, the reference transistor and the stressed transistor are configured as stacked FETs. The pair of matching transistors is then connected to a differential current sense circuit to form a metering circuit. As described above, the differential current sense circuit determines a Vt difference between the (stacked FET) reference transistor and stressed transistor.

Figure 5:
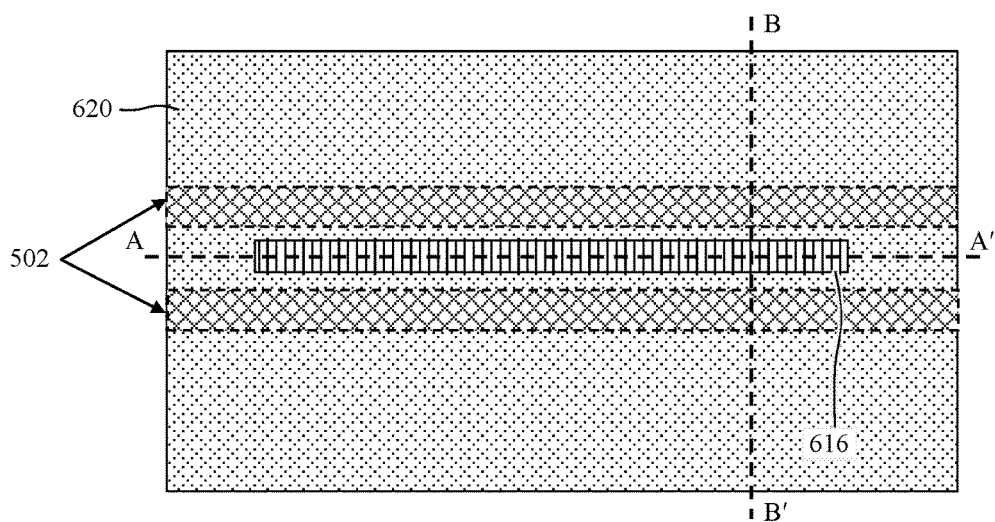
FIG. 5 is a top-down diagram illustrating a stacked bulk fin field-effect transistor (finFET) with buried power rails according to an embodiment of the present invention.
Figure 6:
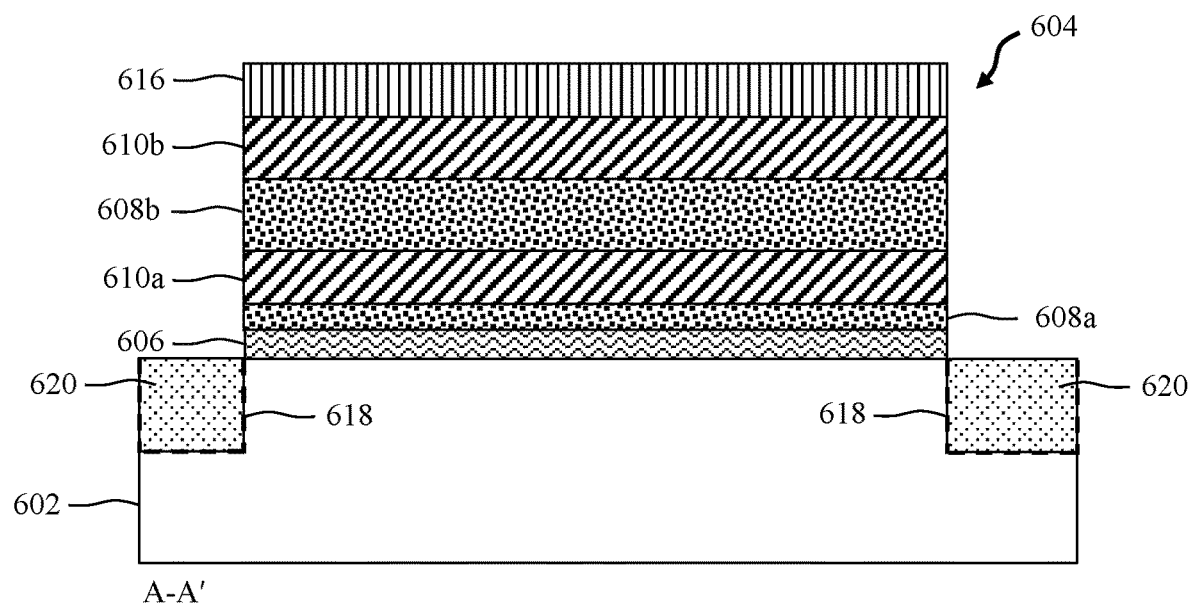
FIG. 6 is a cross-sectional diagram illustrating a view A-A' of the stacked bulk finFET showing a first sacrificial layer and alternating layers of a second sacrificial layer and active layers disposed, one on top of another, as a stack on a substrate according to an embodiment of the present invention.
Figure 7:
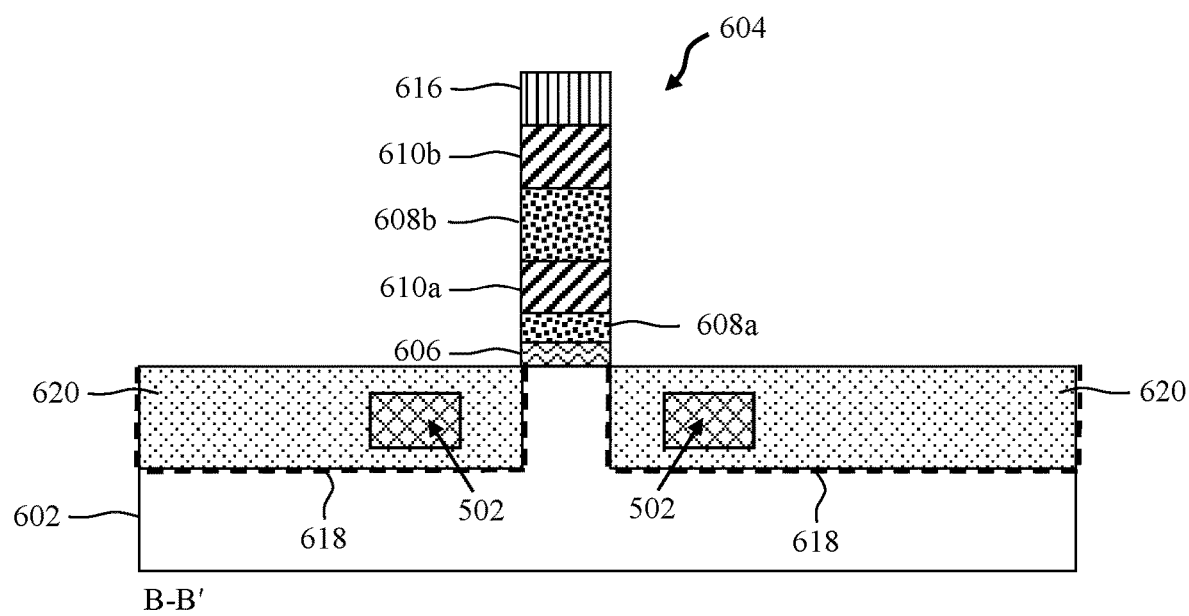
FIG. 7 is a cross-sectional diagram illustrating a view B-B' of the stacked bulk finFET according to an embodiment of the present invention.
Figure 8:
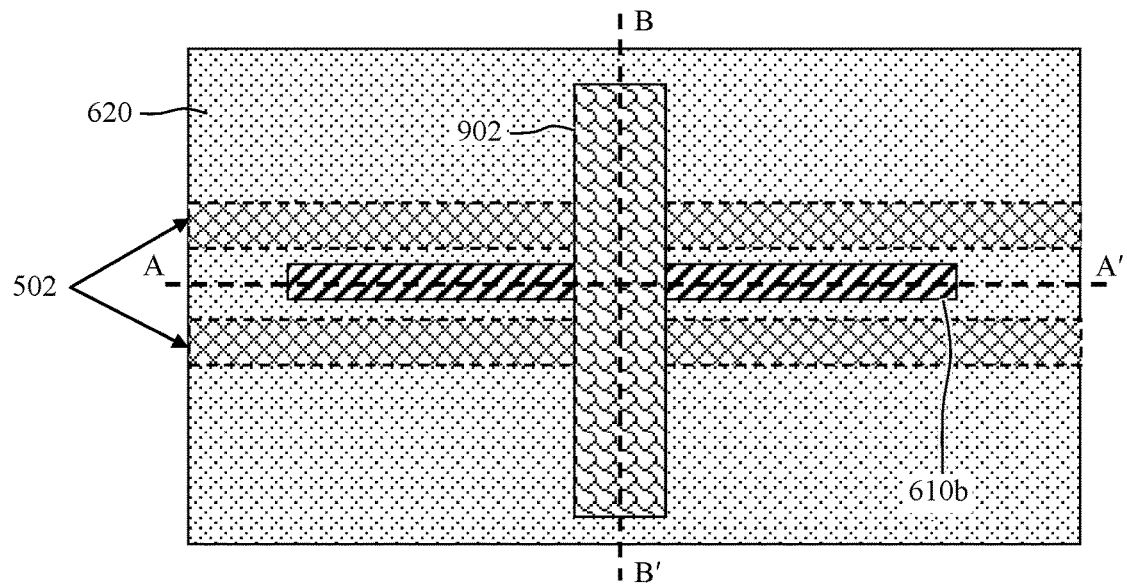
FIG. 8 is a top-down diagram illustrating a sacrificial gate hardmask which covers an underlying sacrificial gate according to an embodiment of the present invention.

Namely, an exemplary methodology for fabricating a usage metering device having at least one matching pair of identical reference and stressed transistors is now described by way of reference to FIGS. 5-38. To commence fabrication of the pair of matching (reference and stressed) transistors, as shown in FIGS. 5-7 the process begins with a stacked bulk fin field-effect transistor (finFET) with buried power rails 502. From the top-down view depicted in FIG. 5, only the hardmask 616 over finFET stack 604 (see below) is visible. Further, dashed lines are used in FIG. 5 to indicate that buried power rails 502 are in fact located beneath the surface of a dielectric of shallow trench isolation (STI) regions 620 (see below). Thus, buried power rails 502 too are not visible from the top-down view depicted in FIG. 5.

FIG. 6 provides a cross-sectional view A-A' through the structure of FIG. 5. As shown in FIG. 6, the finFET stack 604 is formed on a substrate 602. According to an exemplary embodiment, substrate 602 is a bulk semiconductor wafer, such as a bulk silicon (Si), bulk germanium (Ge), bulk silicon germanium (SiGe) and/or bulk III-V semiconductor wafer. Alternatively, substrate 602 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 602 may already have pre-built structures (not shown) such as transistors, diodes, capacitors, resistors, interconnects, wiring, etc.

According to an exemplary embodiment, finFET stack 604 is formed by first depositing sacrificial and active layers, one on top of another, as a stack on substrate 602 and then using standard lithography and etching techniques to pattern the sacrificial and active layers into at least one finFET stack 604. In one exemplary non-limiting embodiment, the sacrificial and active layers formed on substrate 602 are nanosheets. The term 'nanosheet,' as used herein, generally refers to a sheet/layer having nanoscale dimensions. Further, the term 'nanosheet' is meant to generally encompass other types of nanoscale structures such as nanowires. For instance, the term 'nanosheet' can refer to a nanowire with a larger width, and/or the term 'nanowire' can refer to a nanosheet with a smaller width, and vice versa.

With standard lithography and etching techniques, a lithographic stack (not shown), e.g., photoresist/organic planarizing layer (OPL)/anti-reflective coating (ARC), is used to pattern a hardmask 616 with the footprint and location of finFET stack 604. Suitable hardmask materials include, but are not limited to, nitride hardmask materials such as silicon nitride (SiN), silicon oxynitride (SiON), silicon carbide nitride (SiCN), and/or oxide hardmask materials such as silicon oxide (SiOx). Alternatively, hardmask 616 can be formed by other suitable techniques, including but not limited to, sidewall image transfer (SIT), self-aligned double patterning (SADP), self-aligned quadruple patterning (SAQP), and other self-aligned multiple patterning (SAMP). An etch is then used to transfer the pattern from the hardmask 616 to the underlying stack of alternating sacrificial and active layers. A directional (i.e., anisotropic) etching process such as reactive ion etching (RIE) can be employed for the stack etch.

In the exemplary embodiment illustrated in FIG. 6, finFET stack 604 includes a (first) sacrificial layer 606 deposited on substrate 602, and alternating layers of (second) sacrificial layers 608a,b, etc. and active layers 610a,b, etc. deposited on (first) sacrificial layer 606. The term 'sacrificial,' as used herein, refers to structures, layers, etc. (such as first/second sacrificial layers 606/608a,b, etc.) that are removed, in whole or in part, during fabrication of the FET device. By contrast, active layers 610a,b, etc. will remain in place and serve as channels of the stack FET device. It is notable that the number of sacrificial layers 606/608a,b, etc. and/or active layers 610a,b, etc. shown in the figures is merely provided as an example intended to illustrate the present techniques. Thus, embodiments are contemplated herein where more or fewer sacrificial layers 606/608a,b, etc. and/or more or fewer active layers 610a,b, etc are present than is shown.

According to an exemplary embodiment, each of the sacrificial layers 606/608a,b, etc. and each of the active layers 610a,b, etc. is deposited on substrate 602 using an epitaxial growth process, whereby a given layer is grown on the preceding layer in the stack. Generally, the sacrificial layers 606/608a,b, etc. and active layers 610a,b, etc. can each have a thickness of from about 5 nanometers (nm) to about 40 nm and ranges therebetween. However, as shown in FIG. 6, the thicknesses can vary amongst the layers.

The materials used to form the sacrificial layers 608a,b, etc. and active layers 610a,b, etc. are chosen such that the sacrificial layers 608a,b, etc. can be removed selective to the active layers 610a,b, etc. during fabrication. Further, as will be described in detail below, the material used to form the sacrificial layer 606 is chosen such that sacrificial layer 606 can be removed selective to sacrificial layers 608a,b, etc. during fabrication in order to form a bottom dielectric isolation layer beneath the finFET stack. A bottom dielectric isolation layer prevents source-to-drain leakage via the substrate 602.

For instance, according to an exemplary embodiment, both the sacrificial layer 606 and the sacrificial layers 608a,b, etc. are formed from SiGe, while the active layers 610a,b, etc. are formed from Si. That way, etchants such as wet hot SC1, vapor phase hydrogen chloride (HCl), vapor phase chlorine trifluoride ($ClF_3$) and other reactive clean processes (RCP) which are selective for etching of SiGe versus Si can be employed in removal of the sacrificial layers 606/608a,b, etc. selective to the active layers 610a,b, etc.

Further, the germanium (Ge) content of the SiGe employed for the sacrificial layers 606/608a,b, etc. can be varied in order to enable removal of sacrificial layer 606 selective to sacrificial layers 608a,b, etc. when forming the bottom dielectric isolation layer. For instance, high Ge content SiGe can be removed selective to low Ge content SiGe using an etchant such as dry HCl. Thus, according to an exemplary embodiment, sacrificial layer 606 is formed from SiGe having a high Ge content, whereas sacrificial layers 608a,b, etc. are formed from SiGe having a low Ge content. For instance, a high Ge content SiGe has from about 50% Ge to about 100% Ge (i.e., pure Ge) and ranges therebetween. A low Ge content SiGe has from about 20% Ge to about 49% Ge and ranges therebetween. According to an exemplary embodiment, sacrificial layer 606 is formed from SiGe50 (which is SiGe having a Ge content of about 50%), and sacrificial layers 608a,b, etc. are formed from SiGe25 (which is SiGe having a Ge content of about 25%).

As highlighted above, the pattern from the hardmask 616 is then transferred to the sacrificial layers 606/608a,b, etc. and active layers 610a,b, etc. using an anisotropic etching process such as RIE to form finFET stack 604. As shown in FIG. 6, following patterning of the finFET stack 604 an additional RIE step can be employed to pattern trenches (shown outlined with dashed lines 618) in substrate 602. These trenches are then filled with a dielectric to form shallow trench isolation (STI) regions 620 in substrate 602 at a base of the finFET stack 604. According to an exemplary embodiment, the dielectric is an oxide material which is also referred to herein as an 'STI oxide.' Suitable STI oxides include, but are not limited to, oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). Although not explicitly shown in the figures, a liner (e.g., a thermal oxide or silicon nitride (SiN)) may be deposited into and lining the trenches prior to the STI oxide.

A process such as chemical vapor deposition (CVD), atomic layer deposition (ALD), or physical vapor deposition (PVD) can be used to deposit the STI oxide into the trenches. Following deposition, the STI oxide can be recessed such that a top surface of the STI regions 620 is coplanar with a top surface of the substrate 602. See FIG. 6.

FIG. 7 provides a cross-sectional view B-B' through the structure of FIG. 5. As shown in FIG. 7, power rails 502 are embedded in the STI regions 620 and run parallel to the patterned finFET stack 604. Standard metallization techniques can be employed to form power rails 502 in the STI regions 620. For instance, according to an exemplary embodiment, trenches are patterned in the STI oxide, a conductor is deposited into the trenches, and the conductor is recessed to form the power rails 502. Additional STI oxide is deposited over and burying the (recessed) power rails 502 in STI regions 620. Following formation of the power rails 502, any remaining hardmask 616 can be removed.

The present fabrication flow employs a replacement metal gate or RMG process where sacrificial gates are placed early on in the process and serve as placeholders during source and drain formation. The sacrificial gates are then later removed and replaced with the final metal gates of the device, also referred to herein as 'replacement metal gates.' Use of a replacement metal gate process is advantageous because it prevents exposure of the metal gate materials to potentially damaging conditions during subsequent processing steps. For instance, the high-κ dielectrics used in replacement metal gate stacks can be damaged by exposure to high temperatures. Thus, these gate stack materials are only placed near the end of the process.

To begin the replacement gate process, at least one sacrificial gate 904 is formed on the finFET stack 604 over what will be the channels of the device. See FIGS. 8-10. From the top-down view depicted in FIG. 8, only the sacrificial gate hardmask 902 that is disposed over the sacrificial gate 904 (see below) is visible. Thus, sacrificial gate 904 is not visible from the top-down view depicted in FIG. 8.

To form the sacrificial gate 904, a sacrificial gate material is first blanket deposited onto the finFET stack 604. Suitable sacrificial gate materials include, but are not limited to, poly-silicon (poly-Si) and/or amorphous silicon (a-Si). A process such as CVD, ALD or PVD can be employed to deposit the sacrificial gate material over the finFET stack 604.

Figure 9:
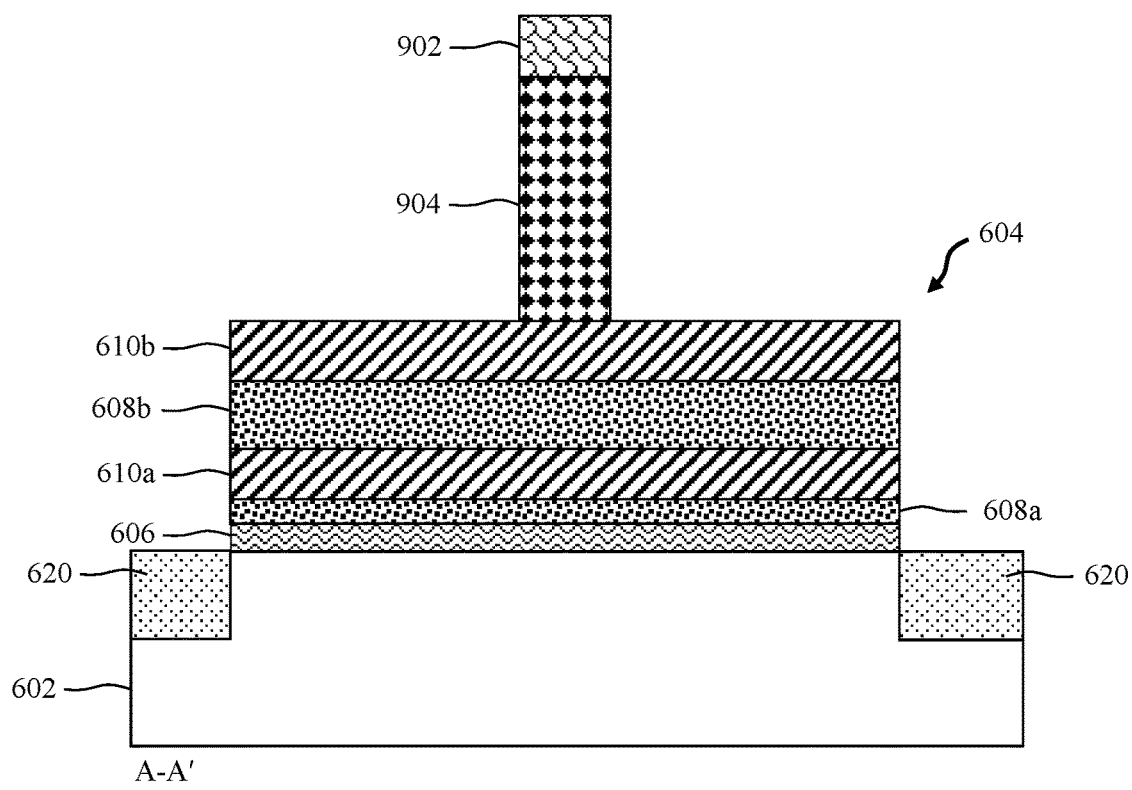
FIG. 9 is a cross-sectional diagram illustrating a view A-A' of the sacrificial gate hardmask and the underlying sacrificial gate having been formed over the stack according to an embodiment of the present invention.
Figure 10:
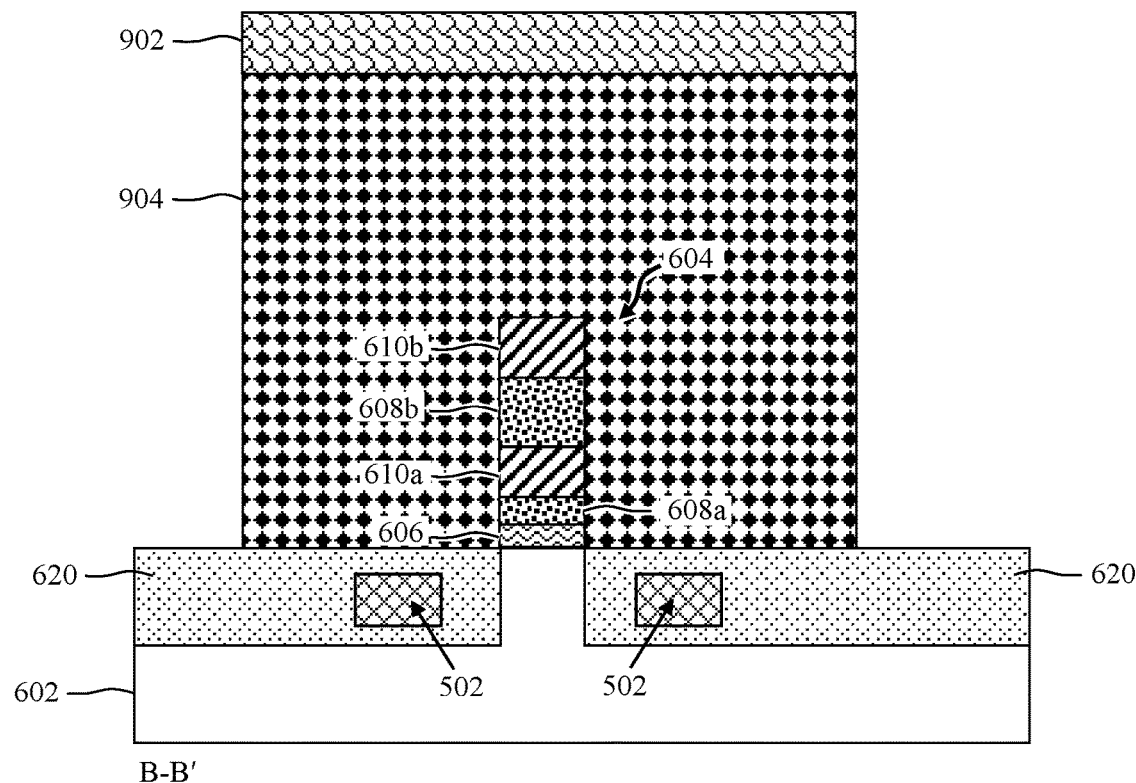
FIG. 10 is a cross-sectional diagram illustrating a view B-B' of the sacrificial gate hardmask and the underlying sacrificial gate having been formed over the stack according to an embodiment of the present invention.
Figure 11:
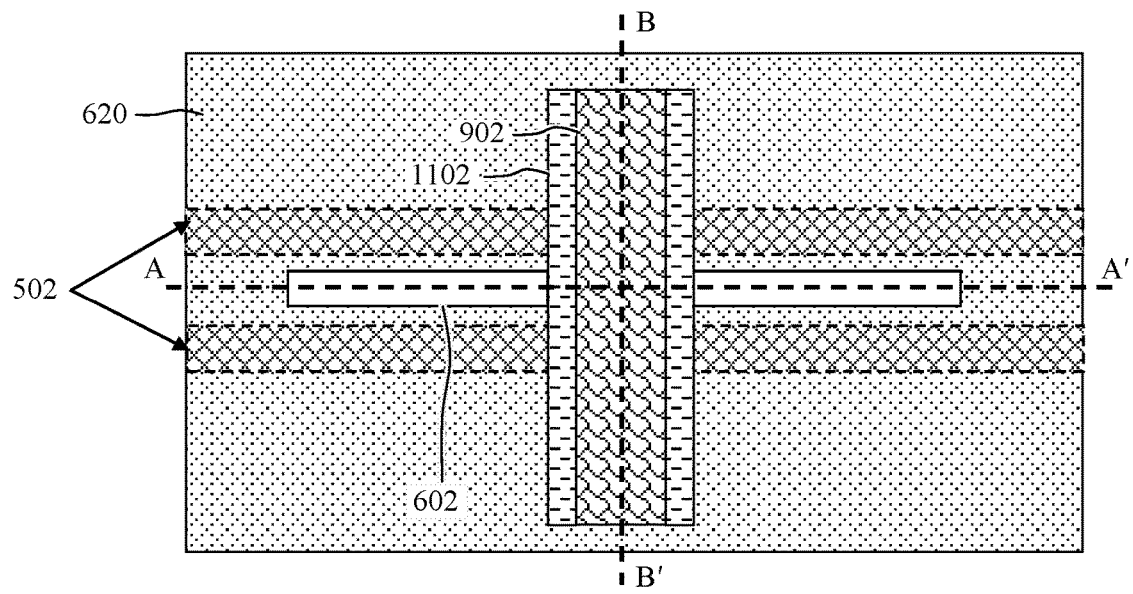
FIG. 11 is a top-down diagram illustrating dielectric spacers having been formed alongside the sacrificial gate hardmask and sacrificial gate, and the sacrificial gate hardmask/sacrificial gate and the dielectric spacers having been used as a mask to pattern the stack according to an embodiment of the present invention.

The sacrificial gate hardmask 902 is then formed on the sacrificial gate material marking the footprint and location of the sacrificial gate 904. Suitable materials for the sacrificial gate hardmask 902 include, but are not limited to, nitride hardmask materials such as SiN, SiON, silicon carbide nitride (SiCN), and/or oxide hardmask materials such as SiOx. An etch is then performed to transfer the pattern from the sacrificial gate hardmask 902 to the sacrificial gate material to form sacrificial gate 904. A directional (anisotropic) etching process such as RIE can be employed for the sacrificial gate etch. The as-patterned sacrificial gate 904 is visible in the cross-sectional views A-A' and B-B' depicted in FIG. 9 and FIG. 10, respectively. As shown in FIG. 9, sacrificial gate 904 is disposed over a central portion of the finFET stack 604 that will serve as a channel region of the device. As shown in FIG. 10, sacrificial gate 904 is oriented orthogonal to the finFET stack 604 such that the sacrificial gate 904 is disposed on the top and along the sidewalls of the finFET stack 604. Further, at the base of the finFET stack 604, the bottom sacrificial gate 904 rests on the STI regions 620 over the buried power rails 502.

Dielectric spacers 1102 are then formed alongside the sacrificial gate hardmask 902/sacrificial gate 904. See FIGS.

11 and 12. As noted above, from the top-down view depicted in FIG. 11, only the sacrificial gate hardmask 902 that is disposed over the sacrificial gate 904 (see below) is visible. Suitable dielectric materials for dielectric spacers 1102 include, but are not limited to, SiN, SiOx, SiC and/or SiCO. A process such as CVD, ALD or PVD can be employed to deposit the dielectric material over the sacrificial gate hardmask 902/sacrificial gate 904. A directional (anisotropic) etching process such as RIE can then be used to pattern the dielectric material into the individual dielectric spacers 1102 on opposite sides of the sacrificial gate hardmask 902/sacrificial gate 904.

The sacrificial gate hardmask 902/sacrificial gate 904 and dielectric spacers 1102 are then used as a mask to pattern the finFET stack 604. Namely, a directional (anisotropic) etching process such as RIE is employed to remove portions of the finFET stack 604 not covered/masked by the sacrificial gate hardmask 902/sacrificial gate 904 and dielectric spacers 1102, with substrate 602 acting as an etch stop. Accordingly, following this etch, portions of the finFET stack 604 extending out from under the sacrificial gate hardmask 902/dielectric spacers 1102 is no longer visible from the top-down view shown in FIG. 11.

Figure 12:
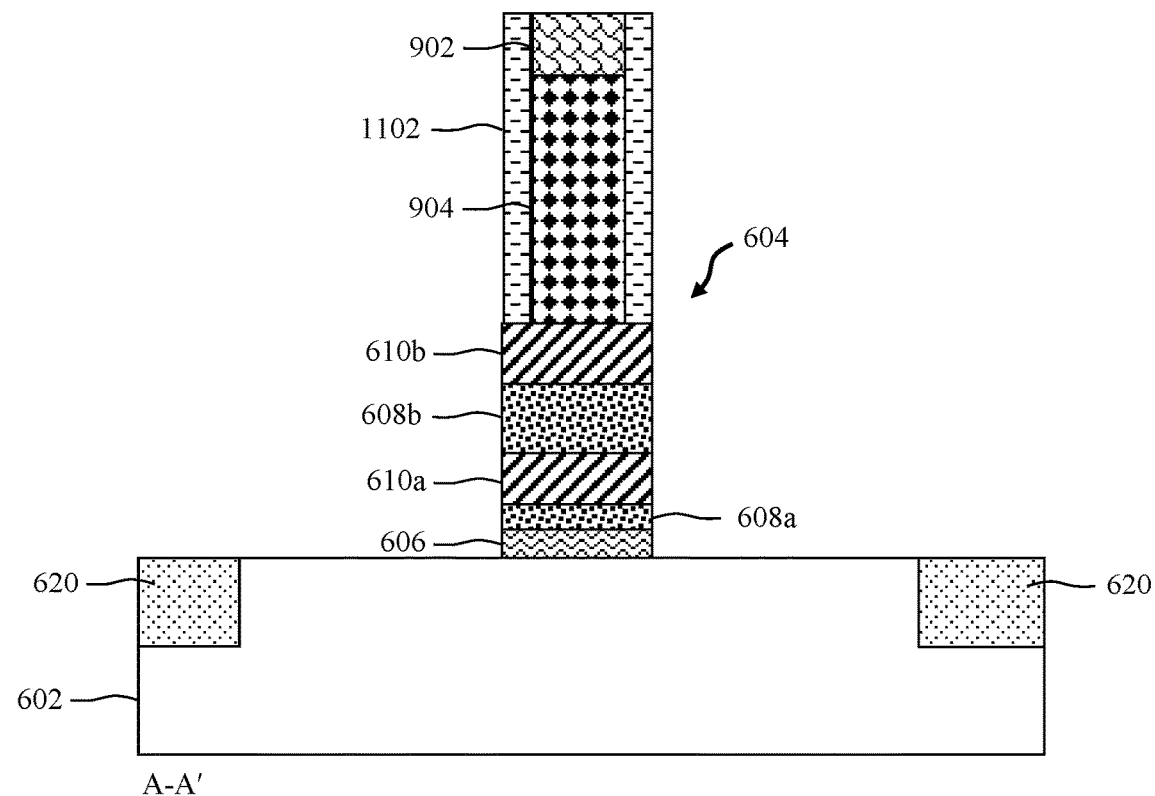
FIG. 12 is a cross-sectional diagram illustrating a view A-A' of the dielectric spacers having been formed alongside the sacrificial gate hardmask and sacrificial gate, and the sacrificial gate hardmask/sacrificial gate and the dielectric spacers having been used as a mask to pattern the stack according to an embodiment of the present invention.
Figure 13:
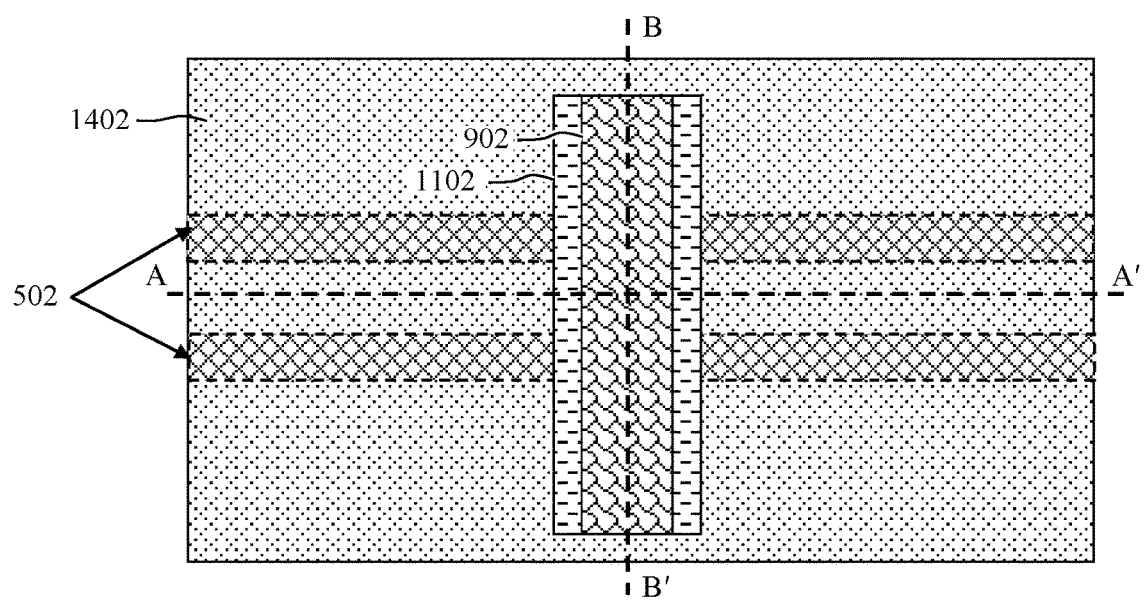
FIG. 13 is a top-down diagram illustrating the first sacrificial layer having been removed and replaced with a bottom dielectric isolation layer according to an embodiment of the present invention.

However, referring to the cross-sectional view A-A' depicted in FIG. 12, it can be seen that the dielectric spacers 1102 are now disposed along opposite sides of the sacrificial gate hardmask 902/sacrificial gate 904, and that the sacrificial gate hardmask 902/sacrificial gate 904 and dielectric spacers 1102 have been used as a mask to pattern the finFET stack 604. Accordingly, as shown in FIG. 12, the sidewalls of the dielectric spacers 1102 are now coplanar with the sidewalls of the finFET stack 604. Patterning the finFET stack 604 stack in this manner exposes the ends of the active layers 610a,b, etc. for formation of the source/drains (see below) which, based on this patterning process, will be self-aligned to the channel regions under the sacrificial gate 904.

The sacrificial layer 606 is then selectively removed from the finFET stack 604 and replaced with a bottom dielectric isolation layer 1402. See FIGS. 13-15. As provided above, a bottom dielectric isolation layer prevents source-to-drain leakage via the substrate 602. From the top-down view depicted in FIG. 13, it can be seen that the bottom dielectric isolation layer 1402 extends beyond the finFET stack 604, and is disposed on the substrate 602 covering the STI regions 620. As shown in the cross-sectional views A-A' and B-B' depicted in FIG. 14 and FIG. 15, respectively, bottom dielectric isolation layer 1402 is now present where the sacrificial layer 606 used to be in the finFET stack 604. Outside of the finFET stack 604, the bottom dielectric isolation layer 1402 can extend up partially along the sidewall of the finFET stack 604. For instance, in the example shown in FIGS. 14 and 15, a top surface of the bottom dielectric isolation layer 1402 along the sidewall of the finFET stack 604 is above the bottom surface of the sacrificial layer 608a.

Formation of the bottom dielectric isolation layer 1402 involves first selectively removing the sacrificial layer 606. As provided above, sacrificial layer 606 can be formed from high Ge content SiGe (e.g., SiGe having from about 50% Ge to about 100% Ge (i.e., pure Ge) and ranges therebetween, such as SiGe50. In that case, an etchant such as dry HCl can be used to remove sacrificial layer 606 forming a cavity (not shown) at the bottom of the finFET stack 604. A dielectric material is then deposited (using, e.g., a process such as CVD, ALD or PVD) into and filling the cavity and over the STI regions 620 to form the bottom dielectric isolation layer 1402 shown in FIGS. 13-15. Suitable dielectric materials for forming the bottom dielectric isolation layer 1402 include, but are not limited to, SiOx and/or SiN.

Figure 14:
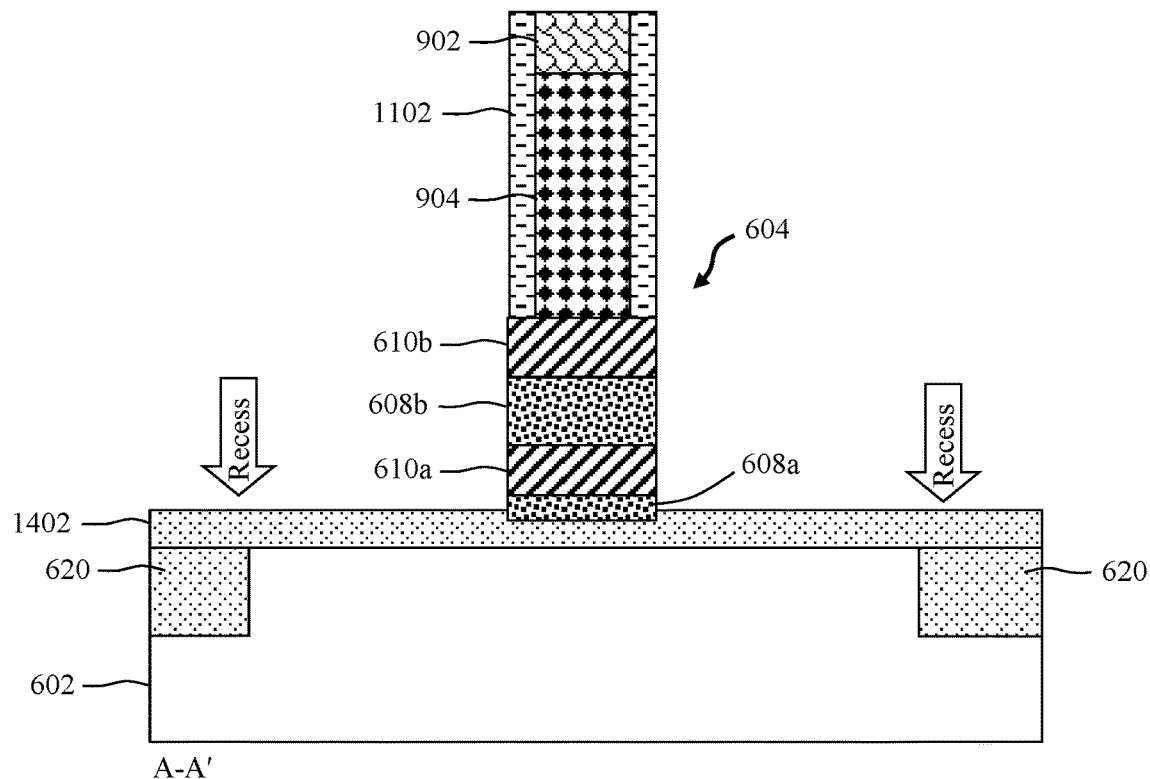
FIG. 14 is a cross-sectional diagram illustrating a view A-A' of the first sacrificial layer having been removed and replaced with a bottom dielectric isolation layer according to an embodiment of the present invention.
Figure 15:
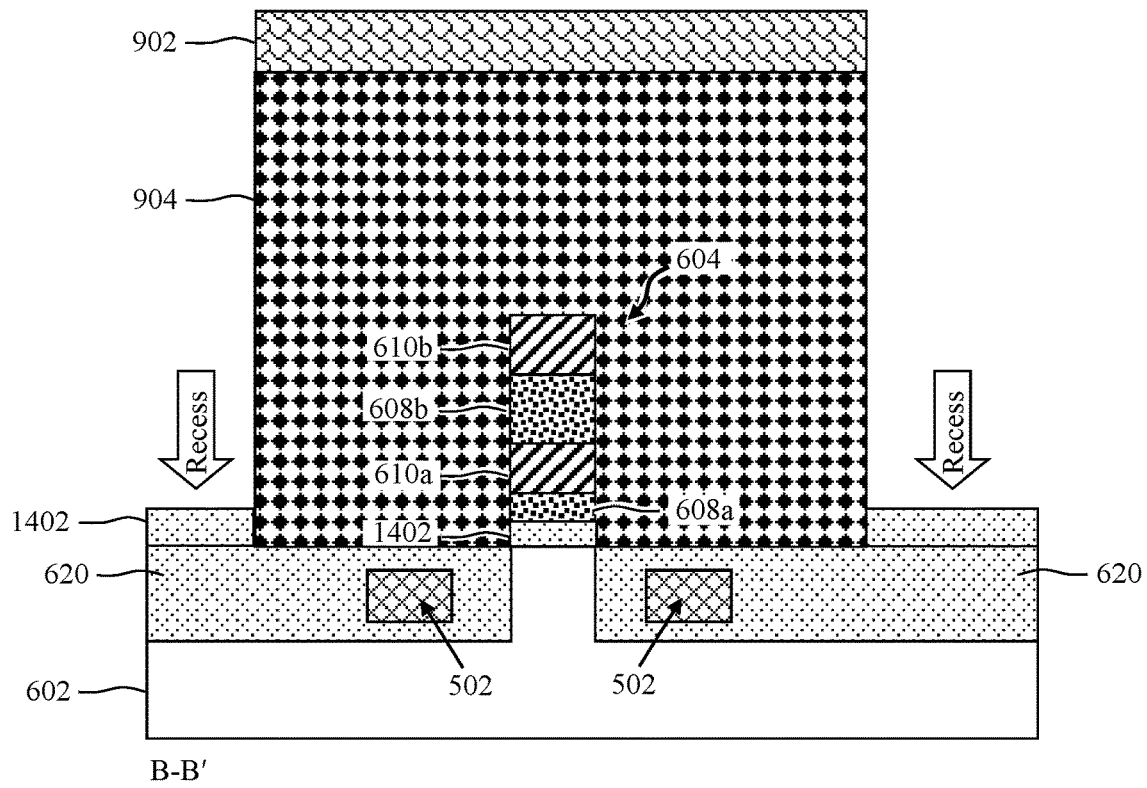
FIG. 15 is a cross-sectional diagram illustrating a view B-B' of the first sacrificial layer having been removed and replaced with a bottom dielectric isolation layer according to an embodiment of the present invention.
Figure 16:
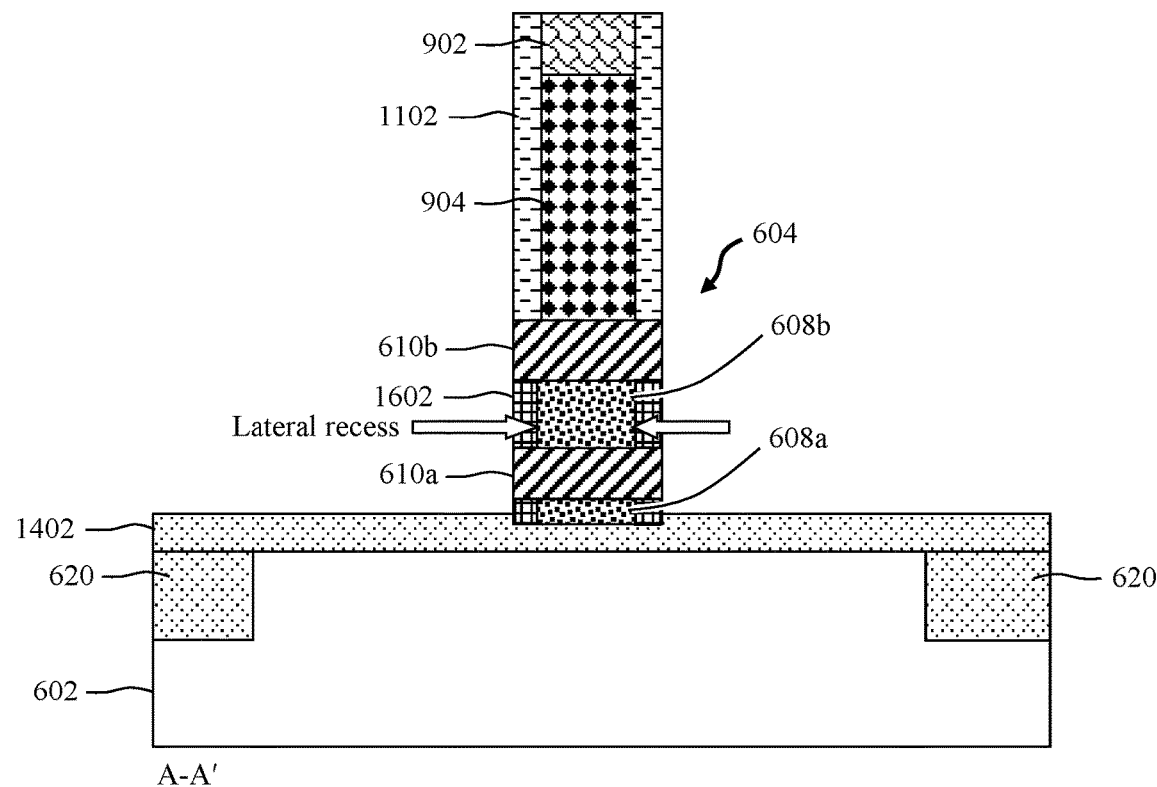
FIG. 16 is a cross-sectional diagram illustrating a view A-A' of a selective etch having been performed to laterally recess the second sacrificial layers to create pockets along the sidewalls of the stack that are then filled with a spacer material to form inner spacers within the pockets according to an embodiment of the present invention.
Figure 17:
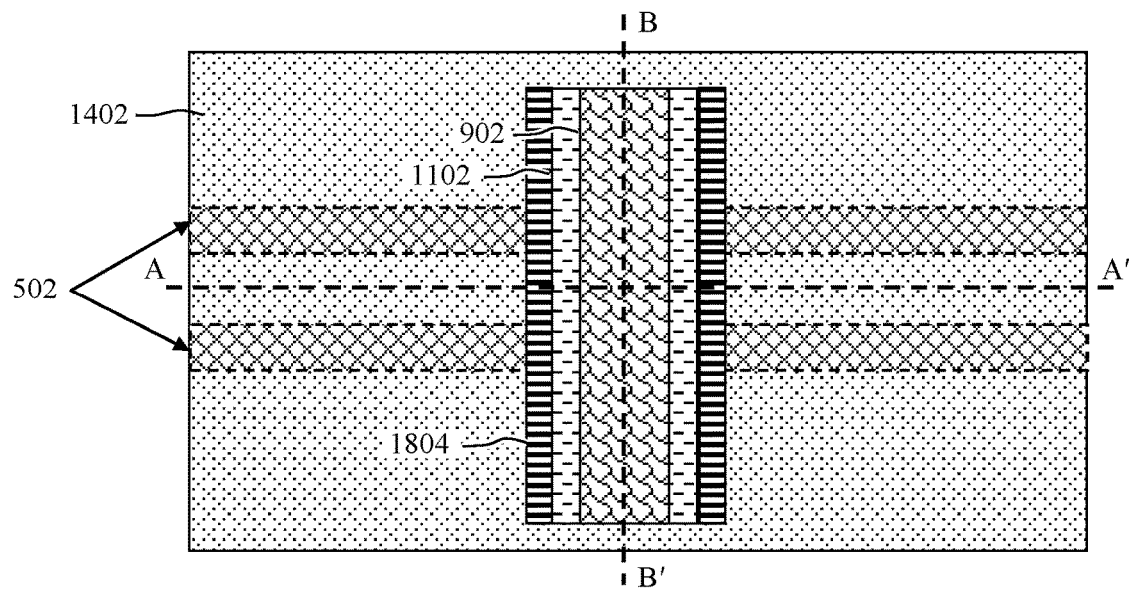
FIG. 17 is a top-down diagram illustrating a second sacrificial spacer having been placed along the sidewalls of the stack covering the active layer at the top of the stack according to an embodiment of the present invention.

As indicated in FIGS. 14 and 15, following deposition, the dielectric material is recessed outside of the finFET stack 604. Preferably, the dielectric material is recessed to expose at least a portion of the bottommost sacrificial layer (in this case sacrificial layer 608a) along the sidewall of the finFET stack 604. Thus, while the bottom dielectric isolation layer 1402 can extend up partially along the sidewall of the finFET stack 604, a top surface of the bottom dielectric isolation layer 1402 is below the top surface of the sacrificial layer 608a. Doing so will enable further processing such as the formation of inner spacers (see below) along the sidewall of the finFET stack 604.

As will be described in detail below, sources/drains will be formed on opposite sides of the sacrificial layers 608a,b, etc. and active layers 610a,b, etc. First, however, inner spacers 1602 are formed alongside sacrificial layers 608a,b, etc. that will serve to offset the source/drains from the replacement metal gate. See cross-sectional view A-A' depicted in FIG. 16.

To form the inner spacers 1602, a selective etch is performed to laterally recess the sacrificial layers 608a,b, etc. exposed along the sidewalls of the finFET stack 604. See FIG. 16. This recess etch creates pockets (not shown) along the sidewalls of the finFET stack 604 that are then filled with a spacer material to form the inner spacers 1602 within the pockets. As provided above, the sacrificial layers 608a,b, etc. can be formed from SiGe, while the active layers 610a,b, etc. are formed from Si. In that case, a SiGe-selective non-directional (isotropic) etching process can be used for the recess etch. Suitable spacer materials include, but are not limited to, SiN, SiOx, SiC and/or SiCO. A process such as CVD, ALD or PVD can be employed to deposit the spacer material into the pockets, followed by an etch such as RIE to remove the excess spacer material.

As will be described in detail below, in the present stacked FET design the sources/drains corresponding to a first FET will be formed at the bottom of the finFET stack 604 on opposite sides of the active layer 610a, after which the sources/drains corresponding to a second FET will be formed at the top of the finFET stack 604 on opposite sides of the active layer 610b. To enable selective exposure of the active layer 610a during formation of the sources/drains of the first FET (while the active layer 610b remains covered/protected), and vice versa, a dual sacrificial spacer configuration is employed. Namely, a (first) sacrificial spacer 1802 is placed along the sidewalls of finFET stack 604 covering the active layer (i.e., active layer 610a) of only the first FET at the bottom of the finFET stack 604, and a (second) sacrificial spacer 1804 is placed along the sidewalls of finFET stack 604 covering the active layer (i.e., active layer 610b) of only the second FET at the top of the finFET stack 604. See FIGS. 17 and 18. From the top-down view depicted in FIG. 17, only the sacrificial spacer 1804 present at the top of the finFET stack 604 is visible.

Figure 18:
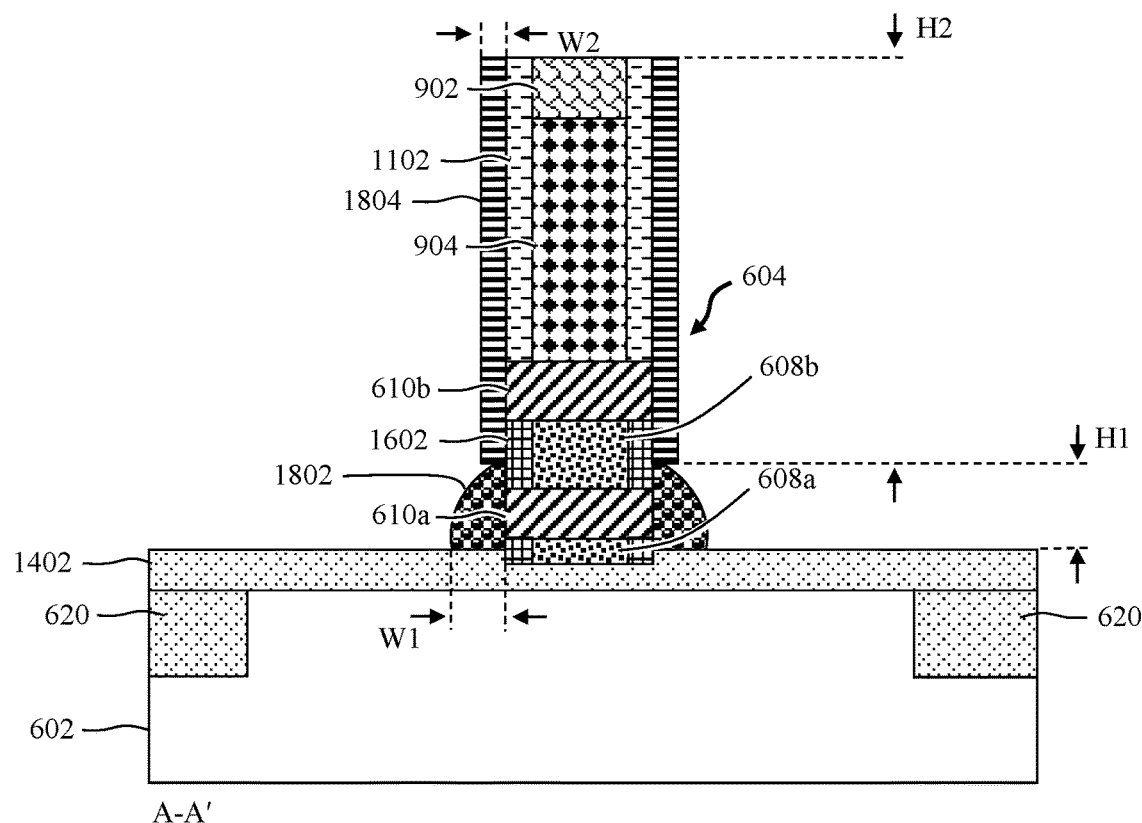
FIG. 18 is a cross-sectional diagram illustrating a view A-A' of a first sacrificial spacer having been placed along the sidewalls of the stack covering the active layer at the bottom of the stack, and the second sacrificial spacer having been placed along the sidewalls of the stack covering the active layer at the top of the stack according to an embodiment of the present invention.
Figure 19:
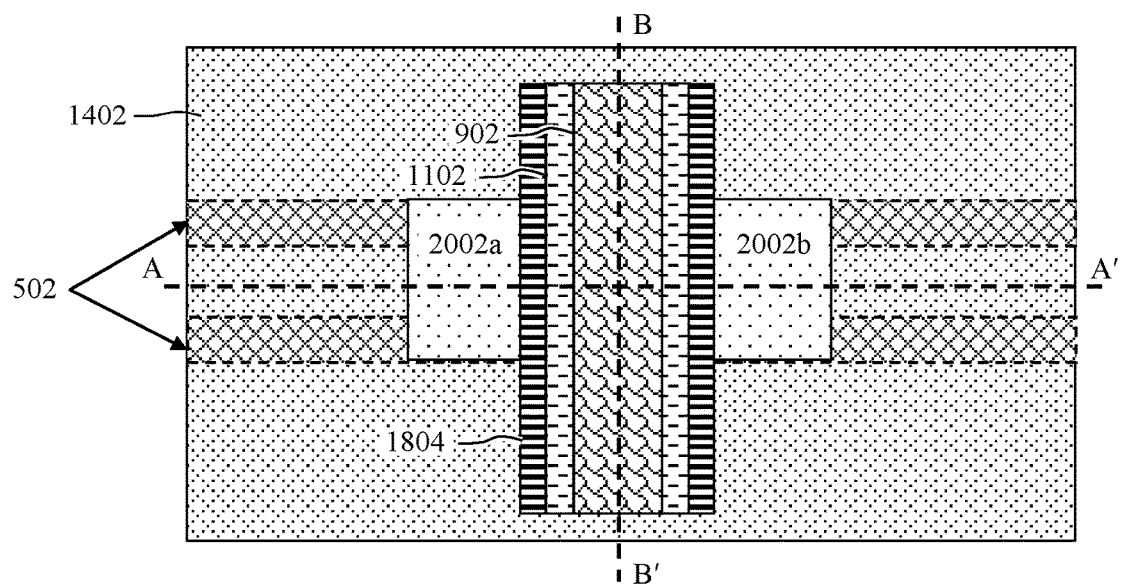
FIG. 19 is a top-down diagram illustrating a first bottom source/drain and a second bottom source/drain having been formed on opposite ends of the active layer at the bottom of the stack according to an embodiment of the present invention.

However, as shown in the cross-sectional view A-A' depicted in FIG. 18, sacrificial spacer 1802 is disposed along the sidewalls of finFET stack 604 covering the active layer 610a at the bottom of the finFET stack 604, and sacrificial spacer 1804 is disposed along the sidewalls of finFET stack 604 covering the active layer 610b at the top of the finFET stack 604. According to an exemplary embodiment, in order to permit removal of the sacrificial spacers 1802 and 1804 selective to one another, sacrificial spacer 1802 is formed from an oxide spacer material such as SiOx, and sacrificial spacer 1804 is formed from a nitride spacer material such as SiN, SiON and/or SiCN, or vice versa.

To form sacrificial spacer 1802 at the bottom of the finFET stack 604, a first spacer material (e.g., either an oxide or nitride spacer material—see above) is first deposited onto the finFET stack 604 using a process such as CVD, ALD or PVD. A directional (anisotropic) etching process such as RIE is then employed to pattern the first spacer material into sacrificial spacer 1802 at the bottom of the finFET stack 604 alongside active layer 610*a*.

The process is then repeated to form the sacrificial spacer 1804 at the top of the finFET stack 604 above the sacrificial spacer 1802. Namely, a second spacer material (e.g., an oxide (or nitride) spacer material if the first spacer material is a nitride (or oxide) spacer material) is first deposited onto the finFET stack 604 using a process such as CVD, ALD or PVD. A directional (anisotropic) etching process such as RIE is then employed to pattern the second spacer material into sacrificial spacer 1804 at the top of the finFET stack 604 alongside active layer 610*b*. As shown in FIG. 18, sacrificial spacer 1802 has a width (W1) that is greater than a width (W2) of sacrificial spacer 1804 (i.e., W1>W2), and sacrificial spacer 1802 has a height (H1) that is less than a height (H2) of sacrificial spacer 1804 (i.e., H1<H2). Notably, employing a thicker/wider bottom spacer enables the height of the sacrificial spacer 1802 to be reduced (during RIE patterning of the spacer—see above) without risk of exposing active layer 610*a*. Further, even though a selective etch can be employed when subsequently forming sacrificial spacer 1804, a thicker/wider bottom spacer ensures that active layer 610*a* remains adequately covered and protected throughout the process.

The sacrificial spacer 1802 at the bottom of the finFET stack 604 is then removed (selective to sacrificial spacer 1804), and a first bottom source/drain 2002*a* and a second bottom source/drain 2002*b* are formed on opposite ends of active layer 610*a*. See FIGS. 19 and 20. From the top-down view depicted in FIG. 19, it can be seen that the sacrificial spacer 1804 at the top of the finFET stack 604 remains in place covering the active layer 610*b*. As shown in the cross-sectional view A-A' depicted in FIG. 20, removal of the sacrificial spacer 1802 exposes the ends of active layer 610*a* along the sidewalls of the finFET stack 604. This enables source/drain 2002*a* and source/drain 2002*b* to be grown from those exposed ends of active layer 610*a*, forming sources/drains 2002*a* and 2002*b* at each end of the active layer 610*a*.

Figure 20:
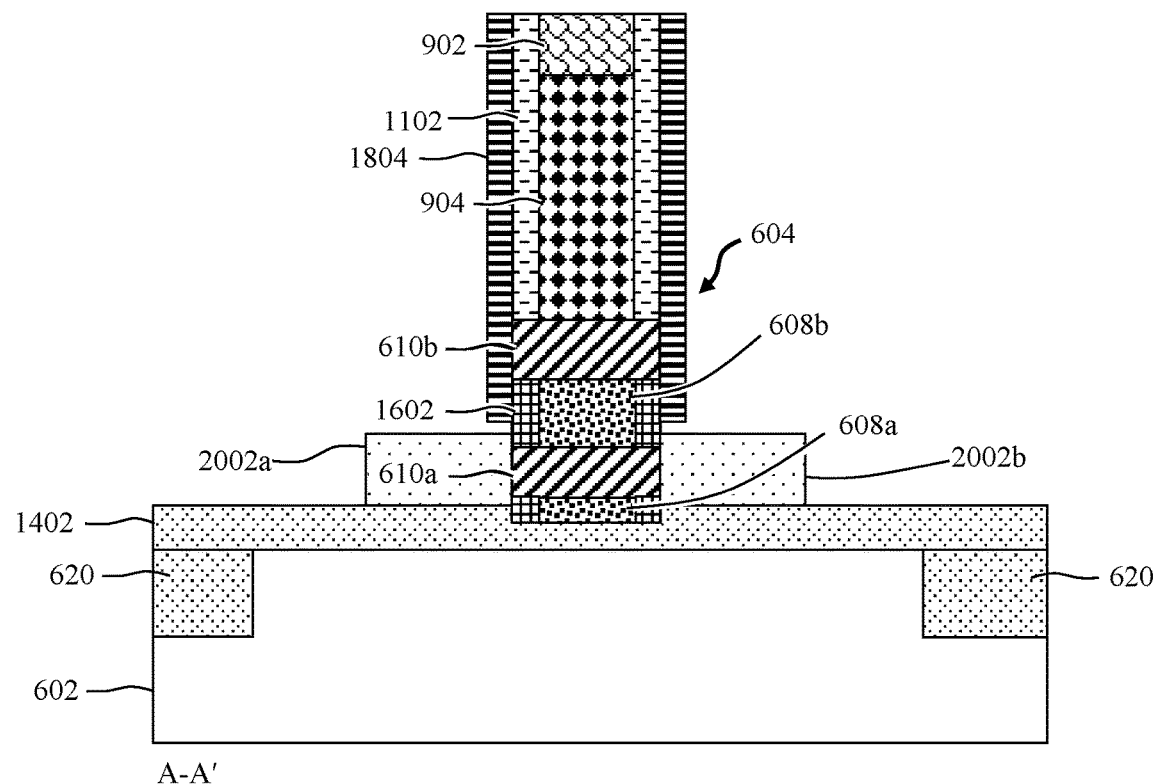
FIG. 20 is a cross-sectional diagram illustrating a view A-A' of the first sacrificial spacer having been removed, and the first bottom source/drain and the second bottom source/drain having been formed on opposite ends of the active layer at the bottom of the stack according to an embodiment of the present invention.
Figure 21:
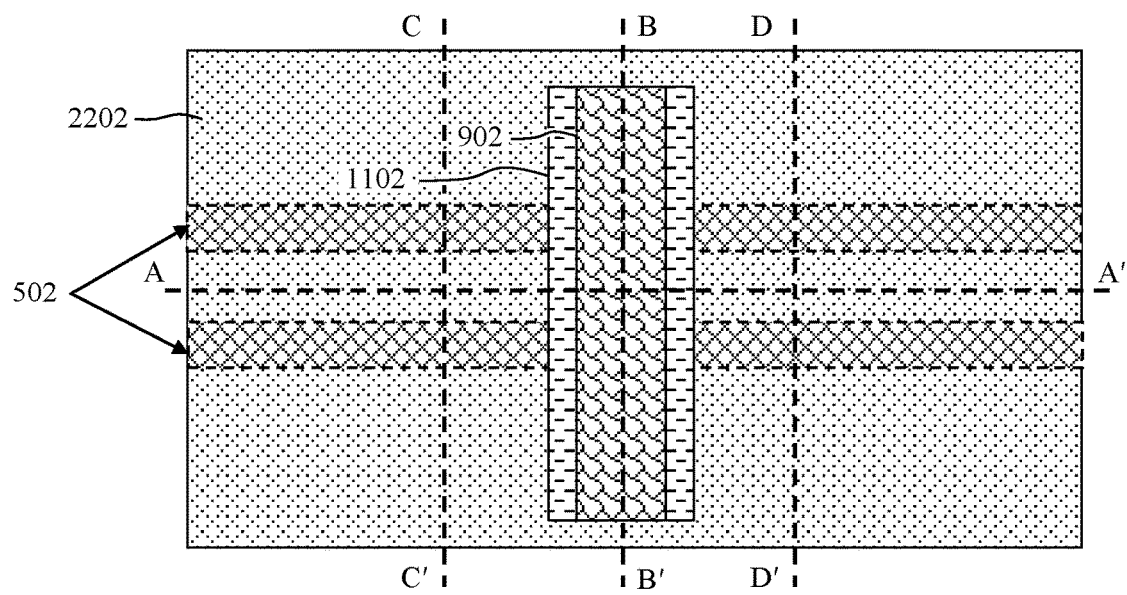
FIG. 21 is a top-down diagram illustrating the second sacrificial spacer having been removed, and a first dielectric layer having been deposited onto the bottom dielectric isolation layer covering/burying the first bottom source/drain and the second bottom source/drain according to an embodiment of the present invention.
Figure 22:
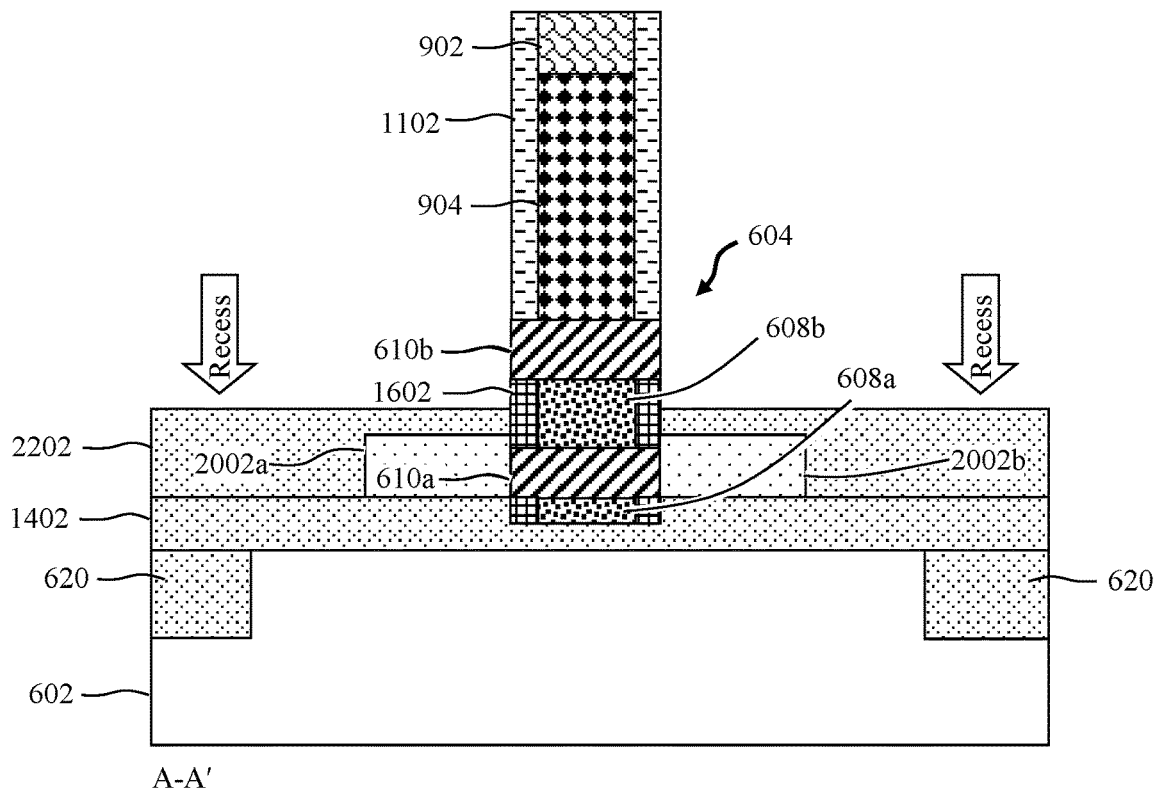
FIG. 22 is a cross-sectional diagram illustrating a view A-A' of the second sacrificial spacer having been removed, and a first dielectric layer having been deposited onto the bottom dielectric isolation layer covering/burying the first bottom source/drain and the second bottom source/drain according to an embodiment of the present invention.

Namely, according to an exemplary embodiment, source/drain 2002*a* and source/drain 2002*b* are grown from an in-situ doped (i.e., during growth) or ex-situ doped (e.g., via ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B), aluminum (Al) and/or gallium (Ga). Advantageously, by way of the previous placement of inner spacers 1602 along the sidewalls of the finFET stack 604 so as to cover sacrificial layers 608*a,b*, etc. (see above), the epitaxial growth of source/drain 2002*a* and source/drain 2002*b* is templated solely from the (exposed) ends of active layer 610*a*. Note that, as provided above, the sacrificial spacer 1804 at the top of the finFET stack 604 remains in place covering the active layer 610*b*. Thus, no epitaxial growth will occur at active layer 610*b* either. As shown in FIG. 20, as-formed, the source/drain 2002*a* and source/drain 2002*b* are disposed directly on the bottom dielectric isolation layer 1402.

As provided above, according to an exemplary embodiment, sacrificial spacer 1802 is formed from a nitride (or an oxide) spacer material, and sacrificial spacer 1804 is formed from an oxide (or nitride) spacer material if sacrificial spacer 1802 is formed from a nitride (or oxide) spacer material. In that case, removal of sacrificial spacer 1802 selective to sacrificial spacer 1804 can be achieved simply by employing a nitride- or an oxide-selective etching process when the sacrificial spacer 1802 is formed from a nitride or oxide spacer material, respectively.

Figure 23:
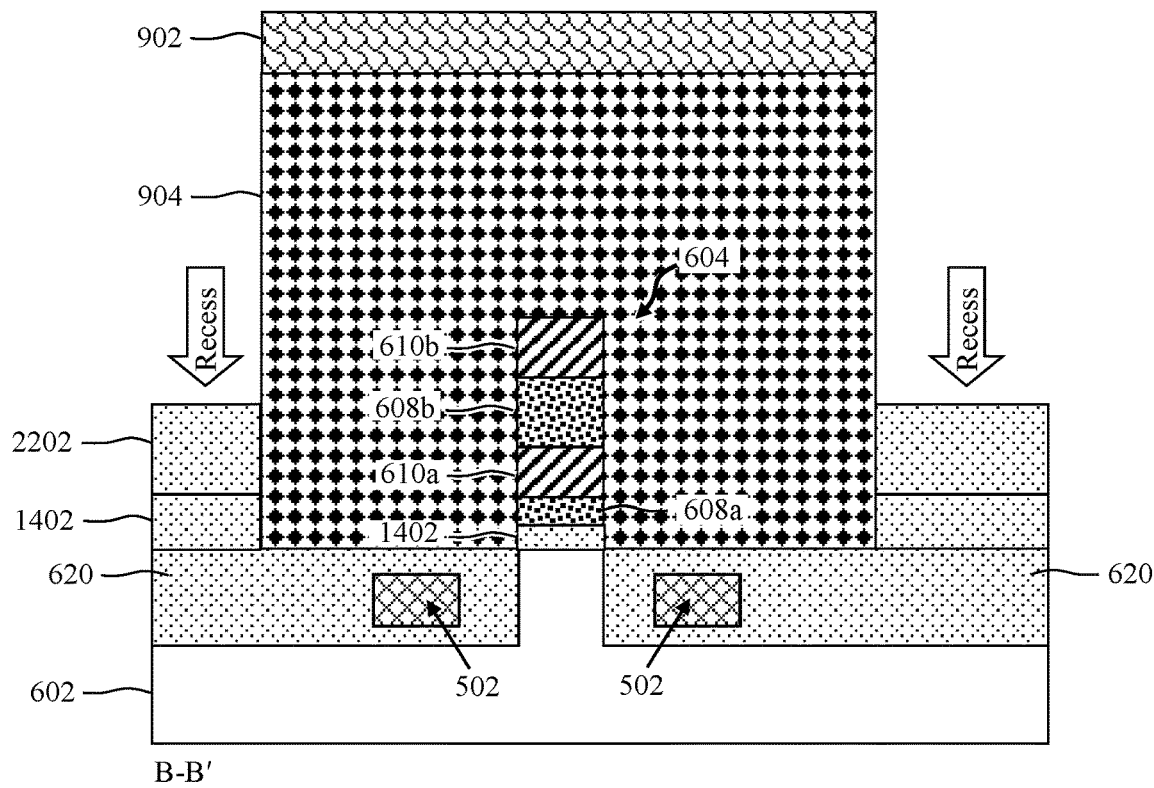
FIG. 23 is a cross-sectional diagram illustrating a view B-B' of the first dielectric layer having been deposited onto the bottom dielectric isolation layer according to an embodiment of the present invention.

Following formation of source/drain 2002*a* and source/drain 2002*b*, sacrificial spacer 1804 at the top of the finFET stack 604 is removed (e.g., using an oxide- or a nitride-selective etching process as the case may be), and a dielectric layer 2202 is deposited onto the bottom dielectric isolation layer 1402 covering/burying the source/drain 2002*a* and source/drain 2002*b*. See FIGS. 21-23. Thus, source/drain 2002*a* and source/drain 2002*b* are no longer visible from the top-down view depicted in FIG. 21. As shown in the cross-sectional views A-A' and B-B' depicted in FIG. 22 and FIG. 23, respectively, following deposition the dielectric layer 2202 is recessed thereby exposing the active layer 610*b* along the sidewalls of the finFET stack 604 (FIG. 22) and sacrificial gate 904 (FIG. 23). Suitable dielectric materials for forming the dielectric layer 2202 include, but are not limited to, SiOx and/or SiN deposited using, e.g., CVD, ALD or PVD. As will become apparent from the description that follows, dielectric layer 2202 serves to isolate the (first) sources/drains 2002*a* and 2002*b* from (second) sources/drains that will be formed on opposite sides of the active layer 610*b*.

Figure 24A:
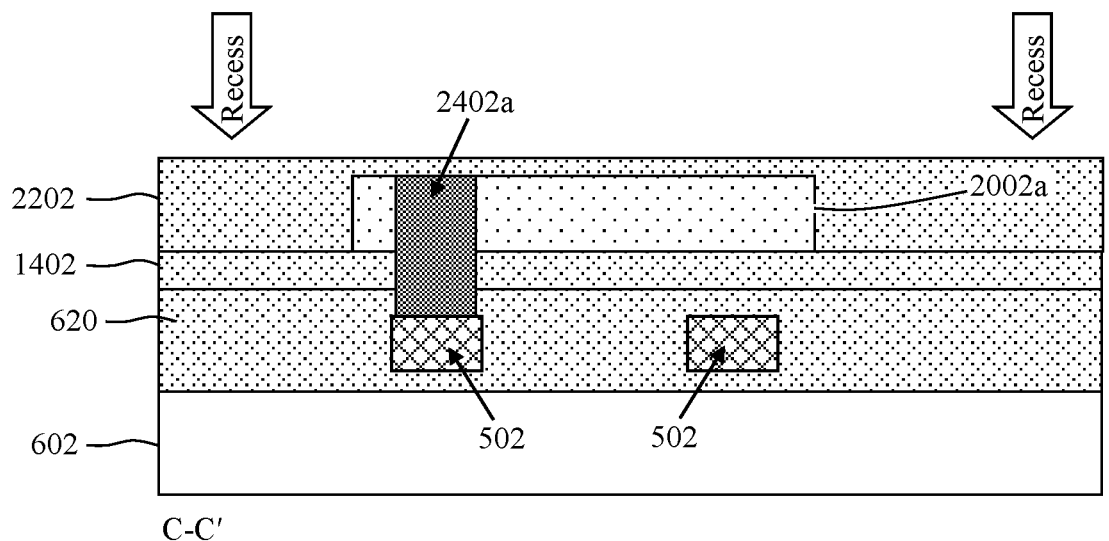
FIG. 24A is a cross-sectional diagram illustrating a view C-C' of a buried contact having been formed connecting the first bottom source/drain to one of the buried power rails according to an embodiment of the present invention.
Figure 24B:
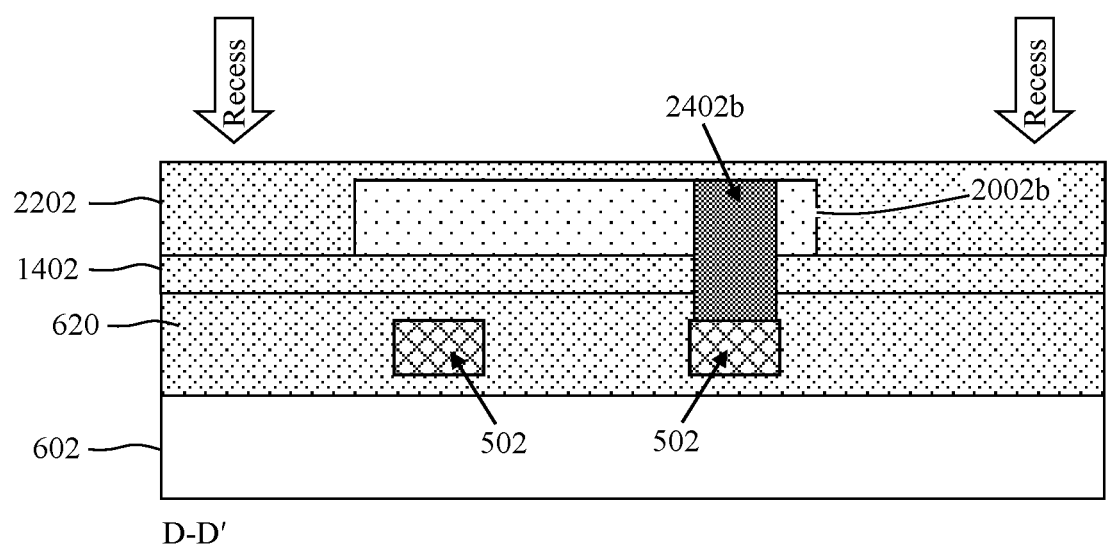
FIG. 24B is a cross-sectional diagram illustrating a view D-D' of another buried contact having been formed connecting the second bottom source/drain to another one of the buried power rails according to an embodiment of the present invention.
Figure 25:
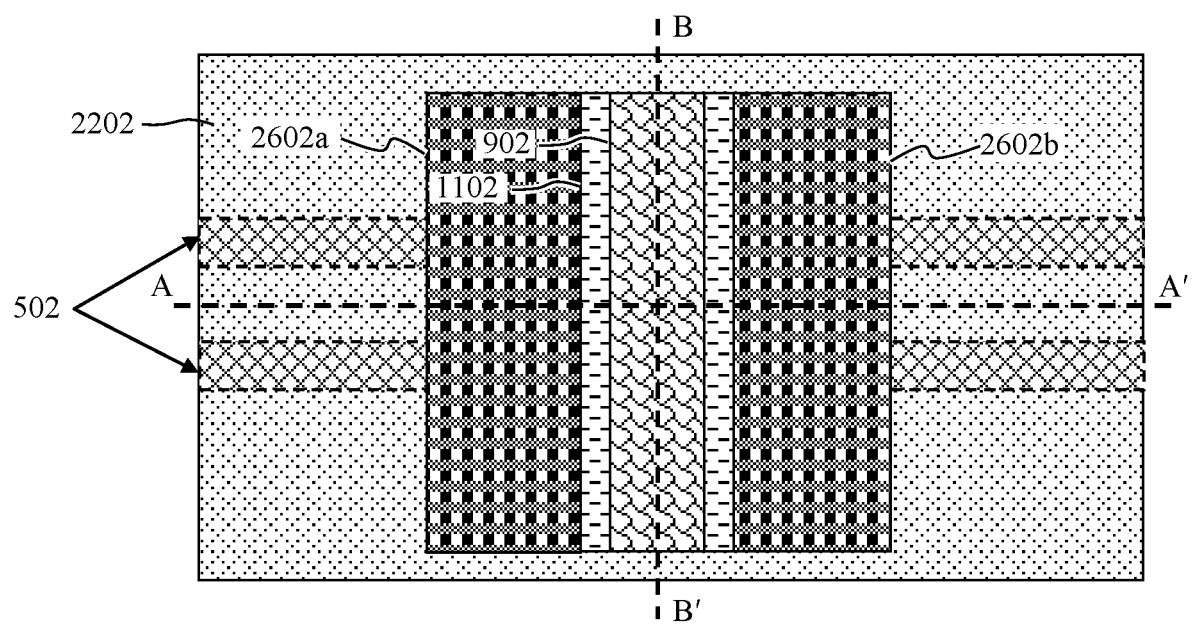
FIG. 25 is a top-down diagram illustrating a first top source/drain and a second top source/drain having been formed on opposite ends of the active layer at the top of the stack according to an embodiment of the present invention.

Prior to depositing the dielectric layer 2202, buried contacts 2402*a* and 2402*b* can be formed connecting source/drain 2002*a* and source/drain 2002*b* to the buried power rails 502. See FIGS. 24A and 24B which provide cross-sectional views C-C' and D-D' (see FIG. 21), respectively. Namely, as shown in FIG. 24A, buried contact 2402*a* connects source/drain 2002*a* to one of the buried power rails 502. As shown in FIG. 24B, buried contact 2402*b* connects source/drain 2002*b* to the other buried power rail 502. Thus, by this configuration, access to source/drain 2002*a* and source/drain 2002*b* of the first/bottom FET device can be made via the buried power rails 502.

Standard metallization techniques can be employed to form buried contacts 2402. For instance, according to an exemplary embodiment, trenches are patterned in sources/drains 2002*a* and 2002*b* and bottom dielectric isolation layer 1402 over power rails 502, and a conductor is deposited into the trenches and planarized to form the buried contacts 2402. In the same manner as described above, dielectric layer 2202 is then deposited over/burying the source/drain 2002*a* and source/drain 2002*b*, as well as the now-formed buried contacts 2402, and recessed.

A first top source/drain 2602*a* and a second top source/drain 2602*b* are then formed on opposite ends of active layer 610*b* on/over the (recessed) dielectric layer 2202. See FIGS. 25 and 26. From the top-down view depicted in FIG. 25, it can be seen that the dielectric spacers 1102 separate source/drain 2602*a* and source/drain 2602*b* from the sacrificial gate hardmask 902 and underlying sacrificial gate 904 which is not visible in this view. As shown in the cross-sectional view A-A' depicted in FIG. 26, source/drain 2602*a* and source/drain 2602*b* are grown from the exposed ends of active layer 610*b* at the top of finFET stack 604, forming sources/drains 2602*a* and 2602*b* at each end of the active layer 610*b*.

Figure 26:
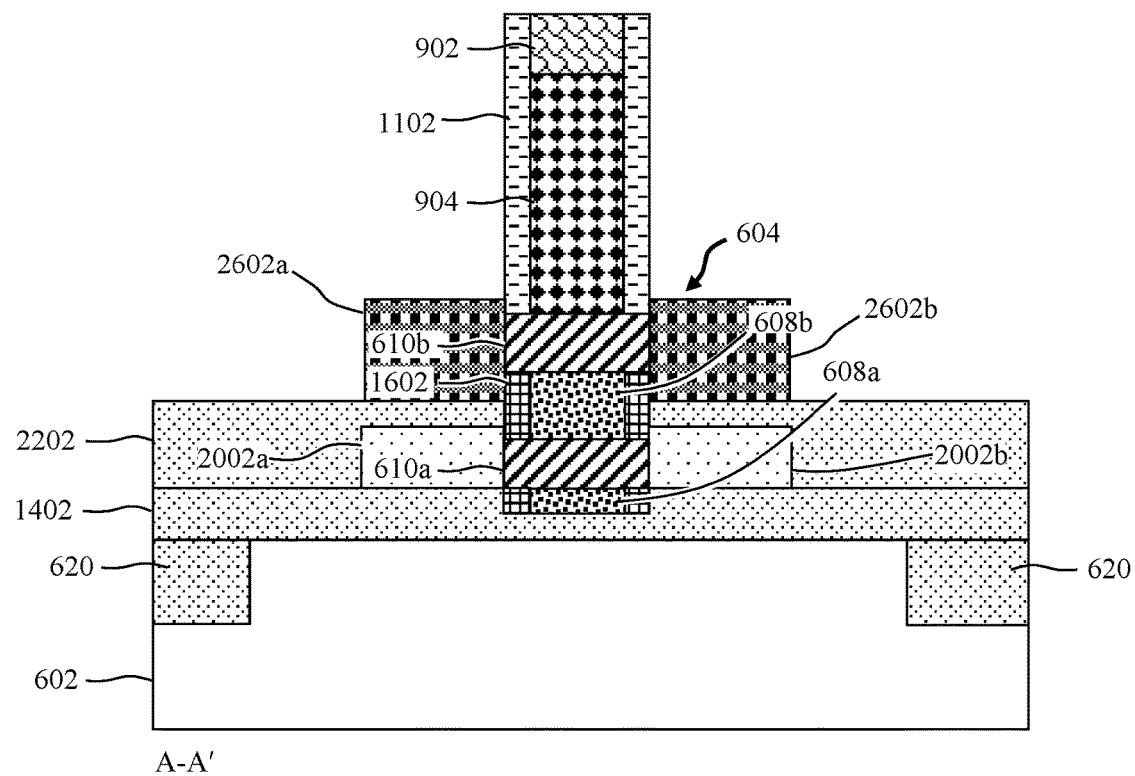
FIG. 26 is a cross-sectional diagram illustrating a view A-A' of the first top source/drain and the second top source/drain having been formed on opposite ends of the active layer at the top of the stack according to an embodiment of the present invention.

Like source/drain 2002*a* and source/drain 2002*b*, according to an exemplary embodiment, source/drain 2602*a* and source/drain 2602b are grown from an in-situ doped (i.e., during growth) or ex-situ doped (e.g., via ion implantation) epitaxial material such as epitaxial Si, epitaxial SiGe, etc. As provided above, suitable n-type dopants include, but are not limited to, P and/or As, and suitable p-type dopants include, but are not limited to, B, Al and/or Ga. Since active layer 610b is the only exposed semiconductor along the sidewall of finFET stack 604, the epitaxial growth of source/drain 2602a and source/drain 2602b is templated solely from the (exposed) ends of active layer 610b. As shown in FIG. 26, as-formed, the source/drain 2602a and source/drain 2602b are disposed directly on dielectric layer 2202.

The next task is to selectively remove the sacrificial gate 904 and replace it with the replacement metal gate. To do so, the sacrificial gate hardmask 902, sacrificial gate 904, and sources/drains 2602a and 2602b are first buried in a dielectric layer 2802, which is deposited onto the dielectric layer 2202 and then polished down to the sacrificial gate hardmask 902. See FIGS. 27-29. Dielectric layer 2802 may also be referred to herein as a 'second' dielectric layer, whereby dielectric layer 2202 is the 'first' dielectric layer.

Figure 27:
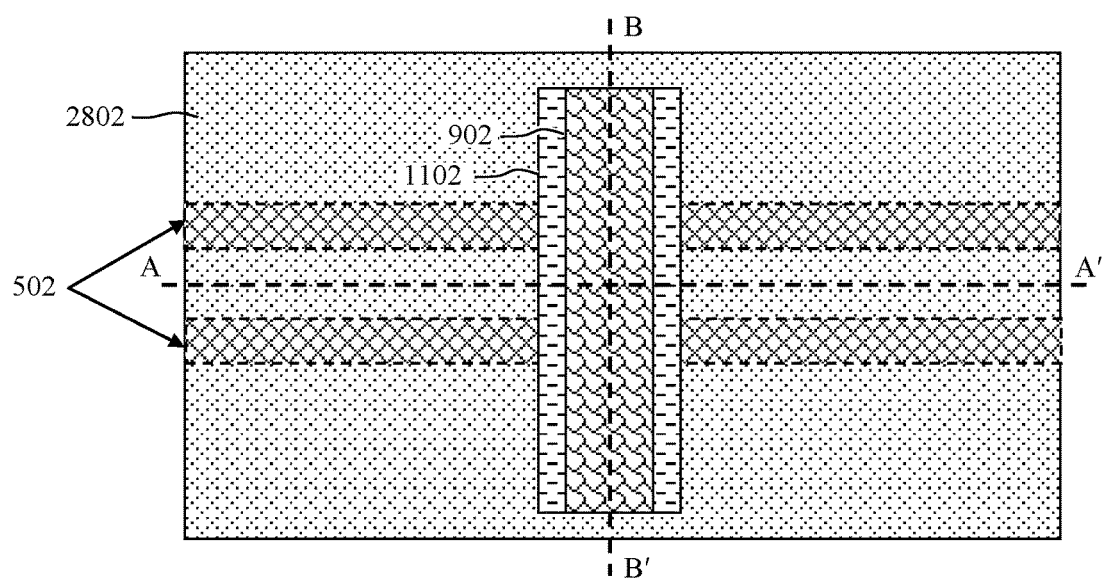
FIG. 27 is a top-down diagram illustrating the sacrificial gate hardmask, the sacrificial gate, and the first/second top source/drain having been buried in a second dielectric layer according to an embodiment of the present invention.
Figure 28:
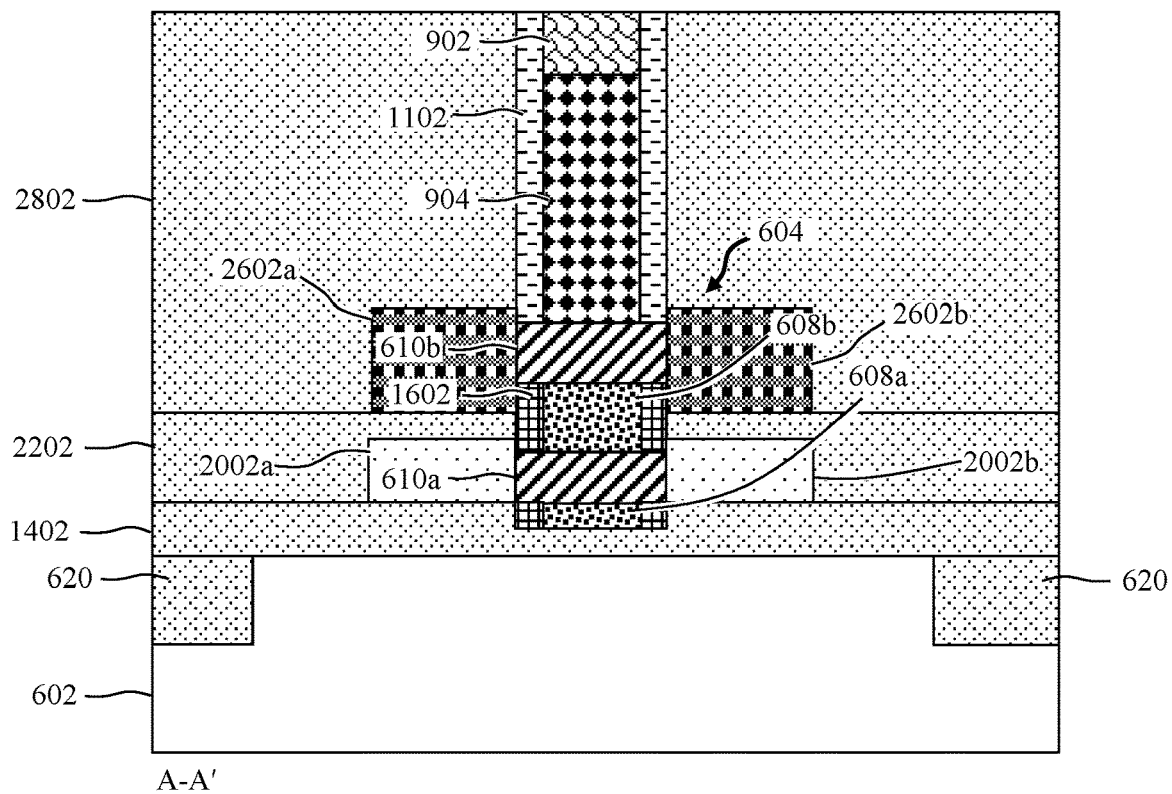
FIG. 28 is a cross-sectional diagram illustrating a view A-A' of the sacrificial gate hardmask, the sacrificial gate, and the first/second top source/drain having been buried in the second dielectric layer according to an embodiment of the present invention.
Figure 29:
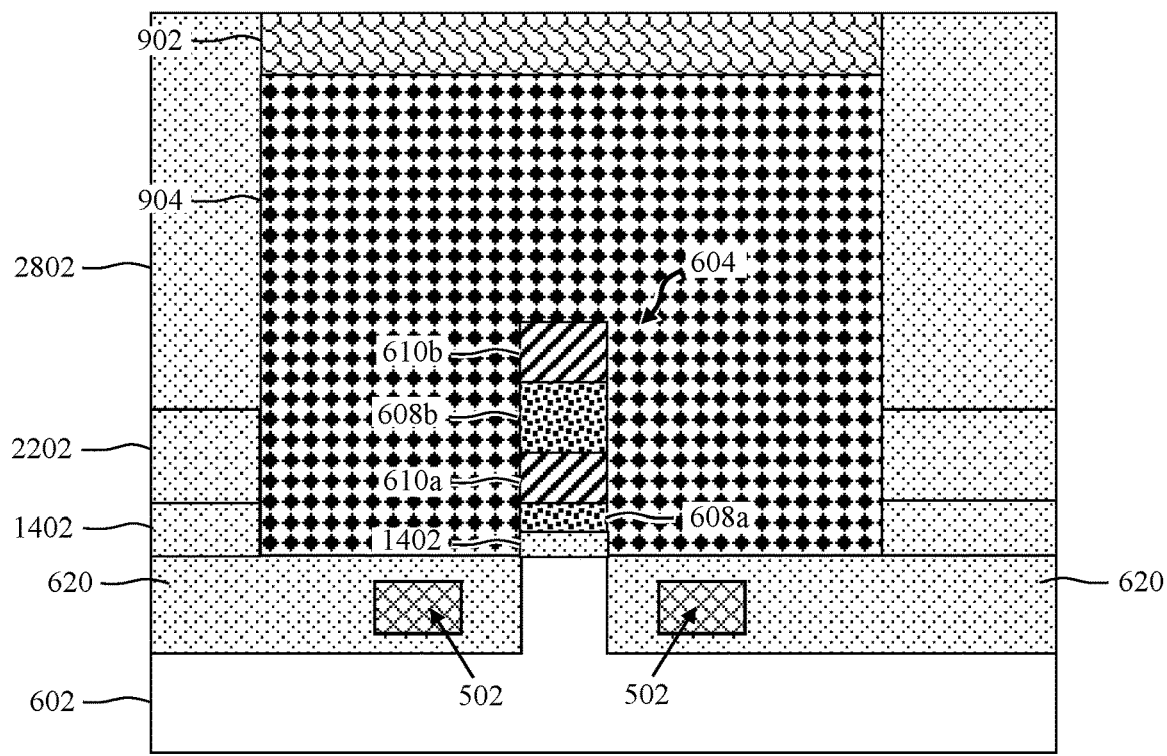
FIG. 29 is a cross-sectional diagram illustrating a view B-B' of the sacrificial gate hardmask and the sacrificial gate having been buried in the second dielectric layer according to an embodiment of the present invention.

It is notable that source/drain 2602a and source/drain 2602b are no longer visible from the top-down view depicted in FIG. 27. As shown in the cross-sectional views A-A' and B-B' depicted in FIG. 28 and FIG. 29, respectively, polishing the dielectric layer 2802 exposes the sacrificial gate hardmask 902 and underlying sacrificial gate 904. As will be described in detail below, this enables the sacrificial gate hardmask 902 and sacrificial gate 904 to be selectively removed. Suitable dielectric materials for forming the dielectric layer 2802 include, but are not limited to, SiOx and/or SiN deposited using, e.g., CVD, ALD or PVD. Following deposition, a process such as chemical mechanical polishing (CMP) can be employed to polish the dielectric layer 2802 down to the sacrificial gate hardmask 902.

The sacrificial gate hardmask 902 and sacrificial gate 904 are next removed selective to the dielectric spacers 1102 and dielectric layer 2802 forming a gate trench(es) 3102 in the dielectric layer 2802. The sacrificial layers 608a,b, etc., now accessible through gate trench 3102, are also removed. See FIGS. 30-32. Doing so enables the replacement metal gate that will be formed in the gate trench 3102 (see below) to surround at least a portion of each of the active layers 610a,b, etc. in a gate-all-around (GAA) configuration. The active layers 610a,b, etc. will be used to form the channels of the stacked FET device.

Figure 30:
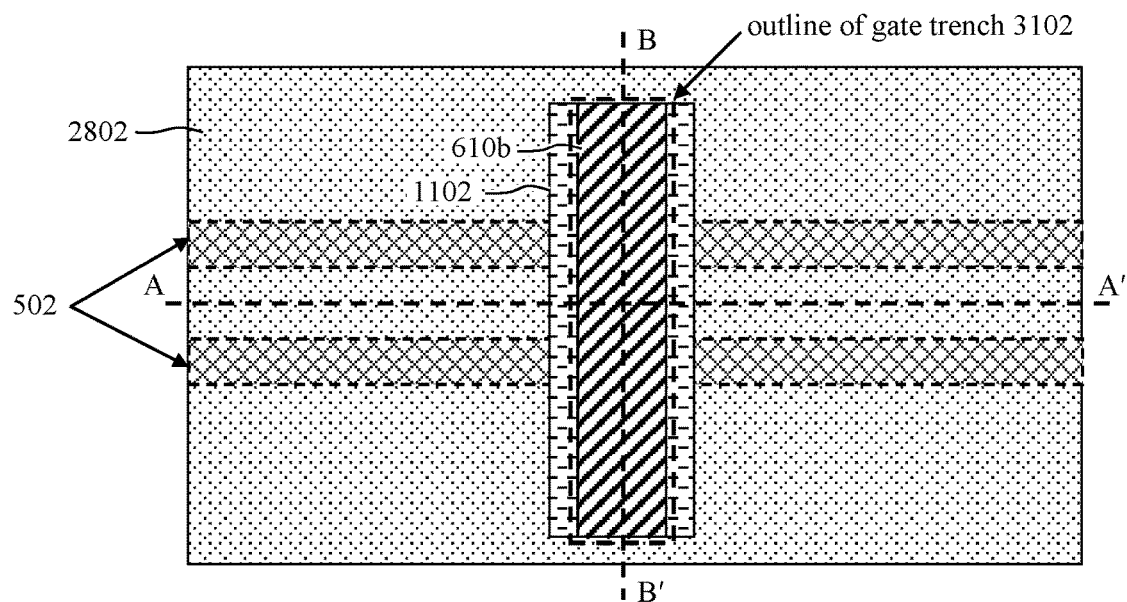
FIG. 30 is a top-down diagram illustrating the sacrificial gate hardmask and the sacrificial gate having been removed forming a gate trench in the second dielectric layer according to an embodiment of the present invention.
Figure 31:
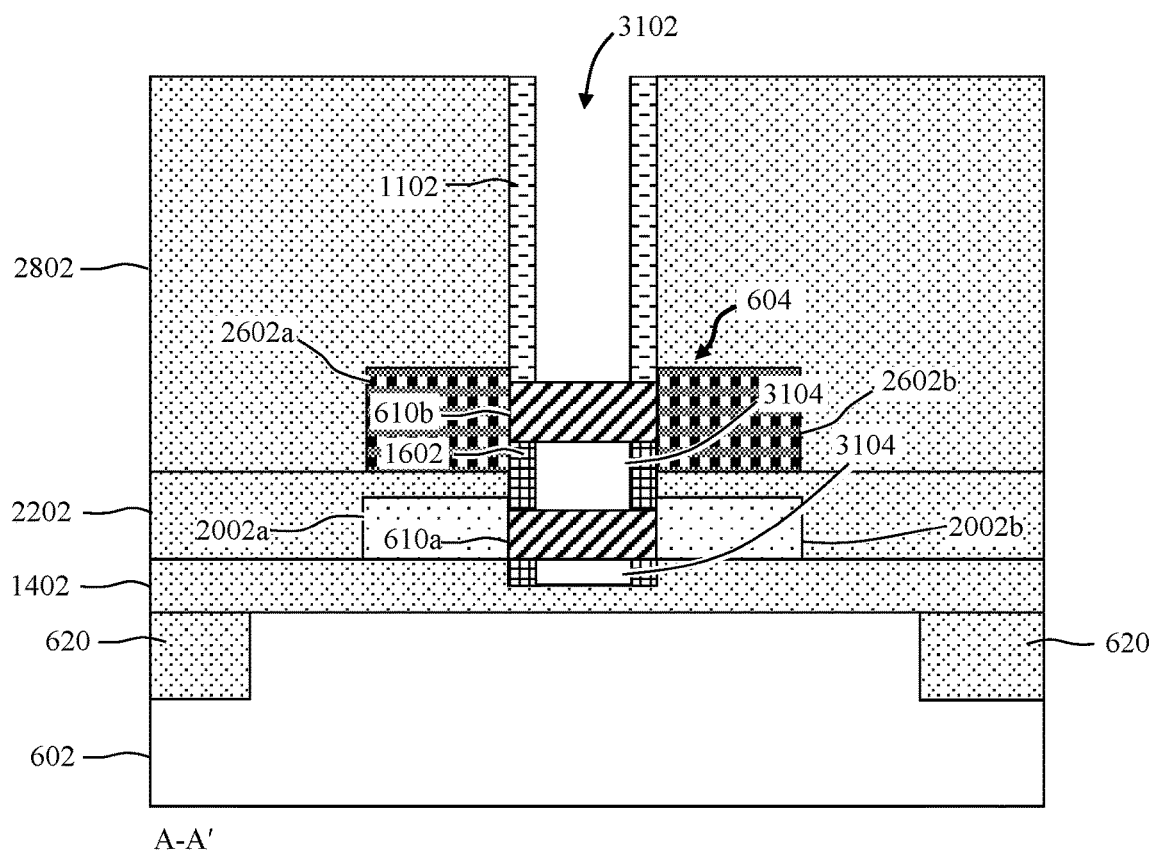
FIG. 31 is a cross-sectional diagram illustrating a view A-A' of the sacrificial gate hardmask and the sacrificial gate having been removed forming the gate trench in the second dielectric layer, and the sacrificial layers in the stack having been removed through the gate trench forming gaps in between the active layers according to an embodiment of the present invention.
Figure 32:
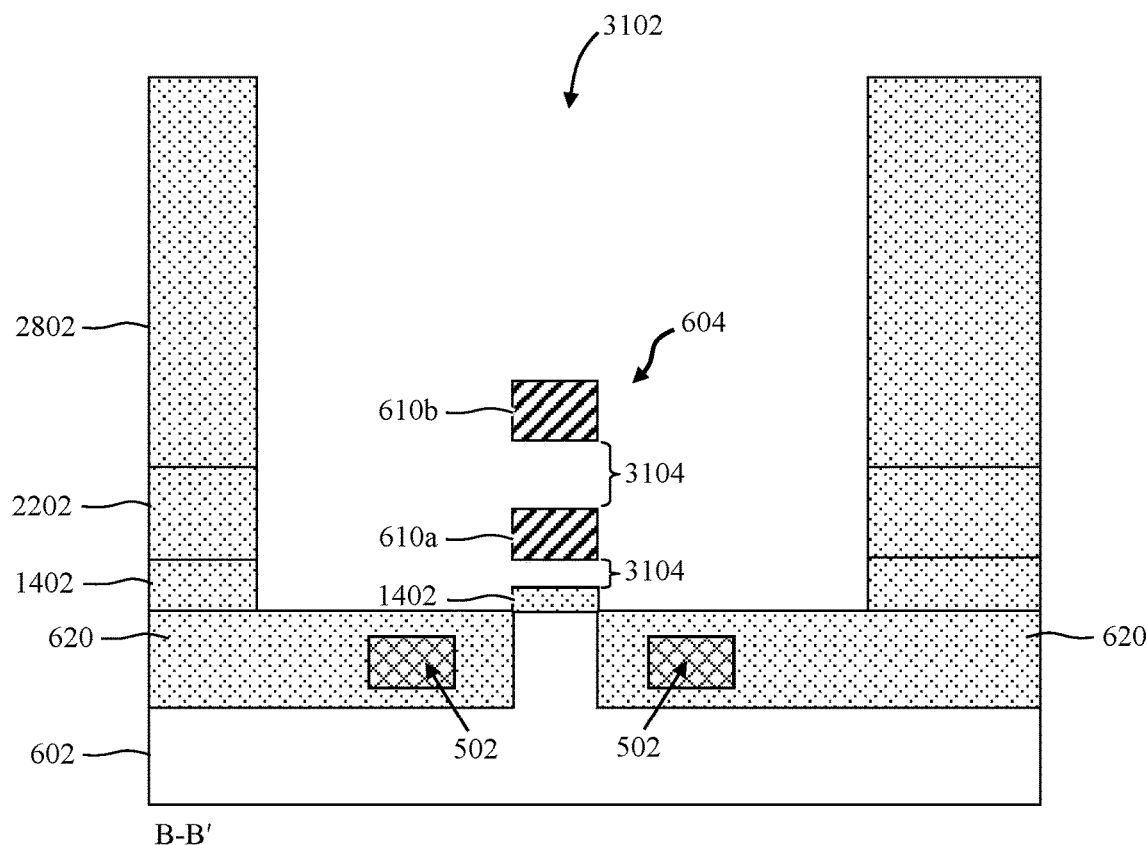
FIG. 32 is a cross-sectional diagram illustrating a view B-B' of the sacrificial gate hardmask and the sacrificial gate having been removed forming the gate trench in the second dielectric layer, and the sacrificial layers in the stack having been removed through the gate trench forming the gaps in between the active layers according to an embodiment of the present invention.

With the sacrificial gate hardmask 902 and sacrificial gate 904 removed, the active layer 610b is now visible in the top-down view depicted in FIG. 30. Dashed lines are used to indicate the outline of gate trench 3102 in FIG. 30. As shown in the cross-sectional views A-A' and B-B' depicted in FIG. 31 and FIG. 32, respectively, removal of the sacrificial layers 608a,b, etc. releases the active layers 610a,b, etc. from the finFET stack 604 in the channel region of the stacked FET device. Following removal of the sacrificial layers 608a,b, etc., gaps 3104 are now present between the active layers 610a,b, etc. As highlighted above, gate trench 3102 and gaps 3104 will enable the replacement metal gates to surround at least a portion of each of the active layers 610a,b, etc. in a GAA configuration. Comparing FIG. 31 and FIG. 32, it can be seen that the active layers 610a,b, etc. remain supported at each end by sources/drains 2002a and 2002b, and sources/drains 2602a and 2602b, respectively.

As provided above, sacrificial gate hardmask 902 can be formed from an oxide or nitride hardmask material. In order to enable removal of the sacrificial gate hardmask 902 selective to the dielectric spacers 1102 and dielectric layer 2802, it is preferable to select a combination of materials for these structures with etch selectivity to one another. For instance, by way of example only, if the sacrificial gate hardmask 902 is formed from an oxide hardmask material, then the dielectric spacers 1102 and dielectric layer 2802 may be formed from a nitride material. That way, an oxide-selective etch such as an oxide-selective RIE can be employed to selectively remove the sacrificial gate hardmask 902. Conversely, if the sacrificial gate hardmask 902 is formed from a nitride hardmask material, then the dielectric spacers 1102 and dielectric layer 2802 may be formed from an oxide material. That way, a nitride-selective etch such as a nitride-selective RIE can be employed to selectively remove the sacrificial gate hardmask 902. Similarly, the underlying sacrificial gate 904 can be selectively removed using a poly-Si and/or a-Si selective etch.

Once the sacrificial gate 904 is removed, access to the sacrificial layers 608a,b, etc. can be made via the gate trench 3102. As provided above, embodiments are contemplated herein where the sacrificial layers 608a,b, etc. are formed from SiGe, and the active layers 610a,b, etc. are formed from Si. In that case, etchants such as wet hot SC1, vapor phase HCl, vapor phase ClF$_3$ and other RCP techniques which are selective for etching of SiGe versus Si can be employed to remove the (SiGe) sacrificial layers 608a,b, etc. selective to the (Si) active layers 610a,b, etc.

Figure 33:
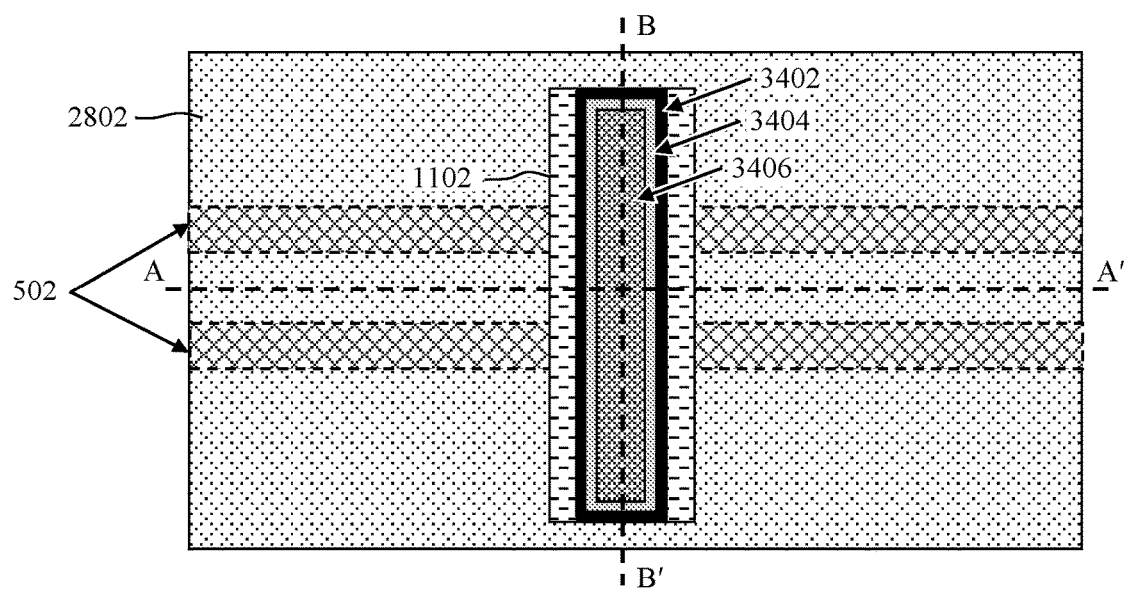
FIG. 33 is a top-down diagram illustrating a replacement metal gate having been formed in the gate trench according to an embodiment of the present invention.
Figure 34:
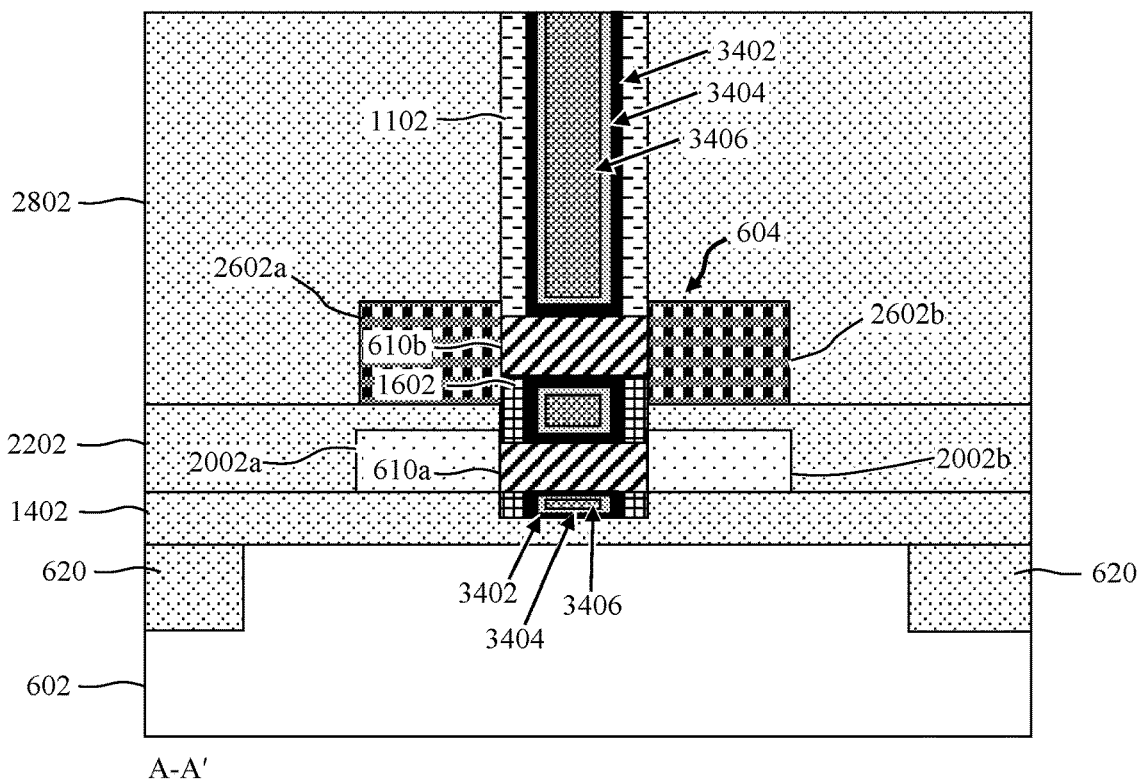
FIG. 34 is a cross-sectional diagram illustrating a view A-A' of replacement metal gate having been formed in the gate trench and in the gaps that surrounds at least a portion of each of the active layers according to an embodiment of the present invention.
Figure 35:
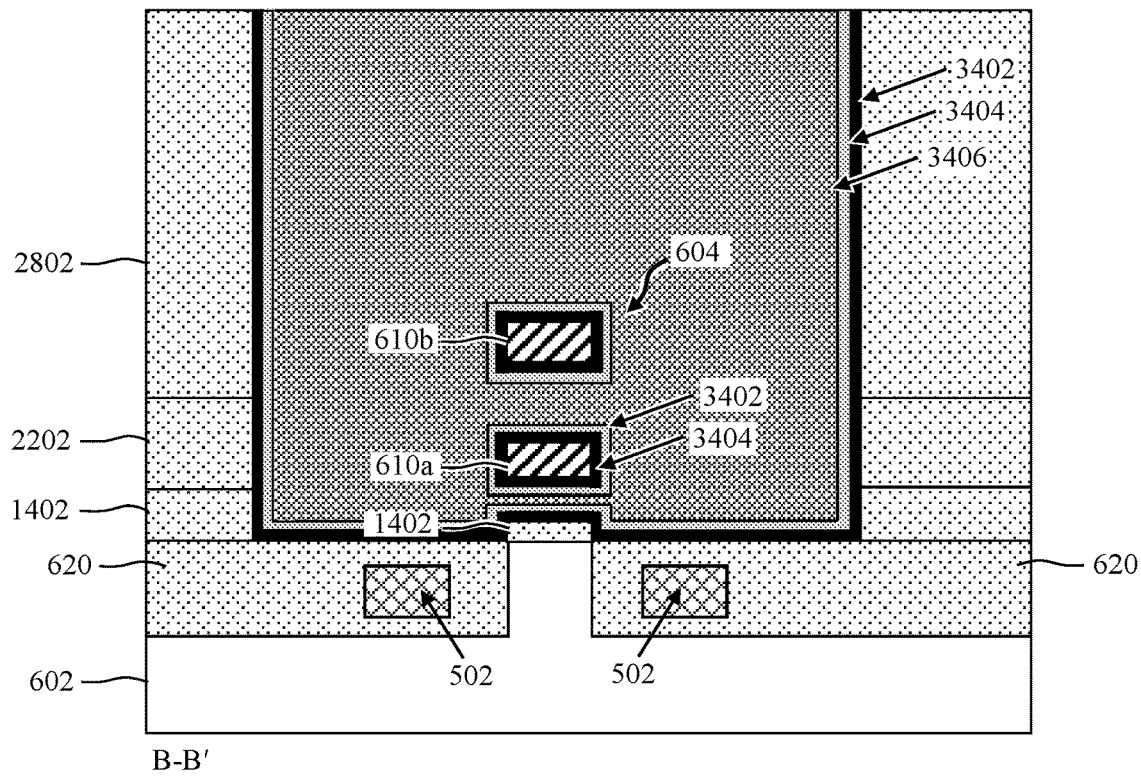
FIG. 35 is a cross-sectional diagram illustrating a view B-B' of the replacement metal gate having been formed in the gate trench and in the gaps that surrounds at least a portion of each of the active layers according to an embodiment of the present invention.

A replacement metal gate(s) is then formed in the gate trench 3102 and gaps 3104 that surround at least a portion of each of the active layers 610a,b, etc. in a GAA configuration. According to an exemplary embodiment, the replacement metal gate includes a conformal gate dielectric 3402 and a conformal workfunction-setting metal 3404 deposited into and lining the gate trench 3102 and gaps 3104, and a fill metal 3406 deposited onto the workfunction-setting metal 3404. See FIGS. 33-35. With the replacement metal gate materials deposited into the gate trench 3102, the active layer 610b is no longer visible in the top-down view depicted in FIG. 33. As shown in FIG. 33, the gate dielectric 3402 is a conformal layer that is deposited into and lining the gate trench 3102. The workfunction-setting metal 3404 too is a conformal layer that is deposited on the gate dielectric 3402. The fill metal 3406 fills in the remaining space. As shown in the cross-sectional views A-A' and B-B' depicted in FIG. 34 and FIG. 35, respectively, the gate dielectric 3402 and workfunction-setting metal 3404 are conformal layers that are deposited into and lining the gate trench 3102 and gaps 3104. The fill metal 3406 fills in the remaining space in the gate trench 3102 and gaps 3104.

According to an exemplary embodiment, gate dielectric 3402 is a high-κ material. The term "high-κ," as used herein, refers to a material having a relative dielectric constant κ which is much higher than that of silicon dioxide (e.g., a dielectric constant κ=25 for hafnium oxide (HfO$_2$) rather than 4 for SiO$_2$). Suitable high-κ gate dielectrics include, but are not limited to, HfO$_2$ and/or lanthanum oxide (La$_2$O$_3$). A process such as CVD, ALD or PVD can be employed to deposit gate dielectric 3402. According to an exemplary embodiment, gate dielectric 1004 has a thickness of from about 1 nm to about 5 nm and ranges therebetween. A reliability anneal can be performed following deposition of gate dielectric 3402. In one exemplary embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as a nitrogen-containing ambient.

According to an exemplary embodiment, workfunction-setting metal 3404 includes at least one n-type or p-type workfunction-setting metal. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above. A process such as CVD, ALD or PVD can be employed to deposit the workfunction-setting metal 3404. According to an exemplary embodiment, the workfunction-setting metal 3404 has a thickness of from about 1 nm to about 5 nm and ranges therebetween.

According to an exemplary embodiment, the fill metal 3406 includes at least one low resistivity metal. Suitable low resistivity metals include, but are not limited to, nickel (Ni), platinum (Pt) and/or tungsten (W). A process such as CVD, ALD, PVD, sputtering or electroplating can be employed to deposit the fill metal 3406. Following deposition, the metal overburden can be removed using a process such as CMP.

Next, (first) contacts 3702 and 3704 are formed to the sources/drains 2602a and 2602b, (second) contacts 3706 and 3708 are formed to the sources/drains 2002a and 2002b, and a (third) contact 3710 is formed to the replacement metal gate. It is notable that contacts 3706 and 3708 access the sources/drains 2002a and 2002b via the buried contacts 2402a/2402b and buried power rails 502. Namely, as described above, buried contact 2402a connects the source/drain 2002a to one of the buried power rails 502, and buried contact 2402b connects the source/drain 2002b to the other buried power rail 502. According to an exemplary embodiment, the contacts 3704 and 3702 are then connected via first/second pass gates PG1 and PG2 to the differential current sense circuit and to an applied voltage (Vdd), respectively, contact 3706 is connected to Vdd, and contact 3708 is connected via third/fourth pass gates PG3 and PG4 to the differential current sense circuit 206 and to ground (GND), respectively. See FIGS. 36-38. It is notable that, in this exemplary configuration, the first/bottom FET serves as the stressed transistor, and the second/top FET serves as the reference transistor. However, since the bottom/top transistors are identical to one another, that assignment is purely arbitrary, and embodiments are contemplated herein where the first/bottom FET instead serves as the reference transistor while the second/top FET serves as the stressed transistor.

Figure 36:
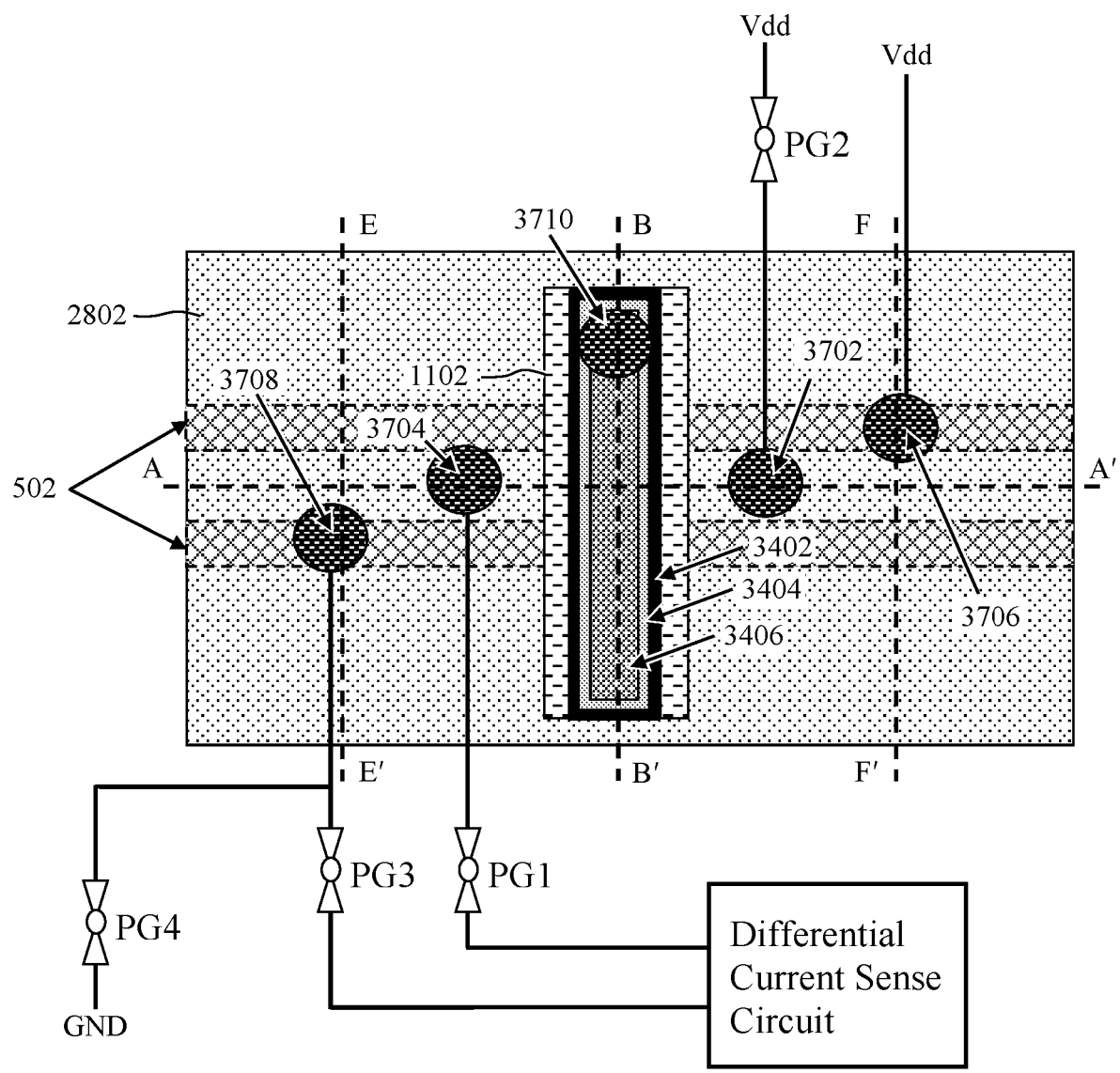
FIG. 36 is a top-down diagram illustrating first contacts having been formed to the first/second top source/drain, second contacts having been formed to the first/second bottom source/drain, and a third contact having been formed to the replacement metal gate according to an embodiment of the present invention.

Referring to the top-down view depicted in FIG. 36, it can be seen that contacts 3702 and 3704 are positioned over the location of source/drain 2602a and source/drain 2602b, respectively, of the second/top FET. While source/drain 2602a and source/drain 2602b are not visible in FIG. 36, their locations can be ascertained by referring to FIG. 25 (described above). Contacts 3706 and 3708 are positioned over the buried power rails 502 through which access to source/drain 2002a and source/drain 2002b of the first/bottom FET is obtained, as described above.

Figure 37:
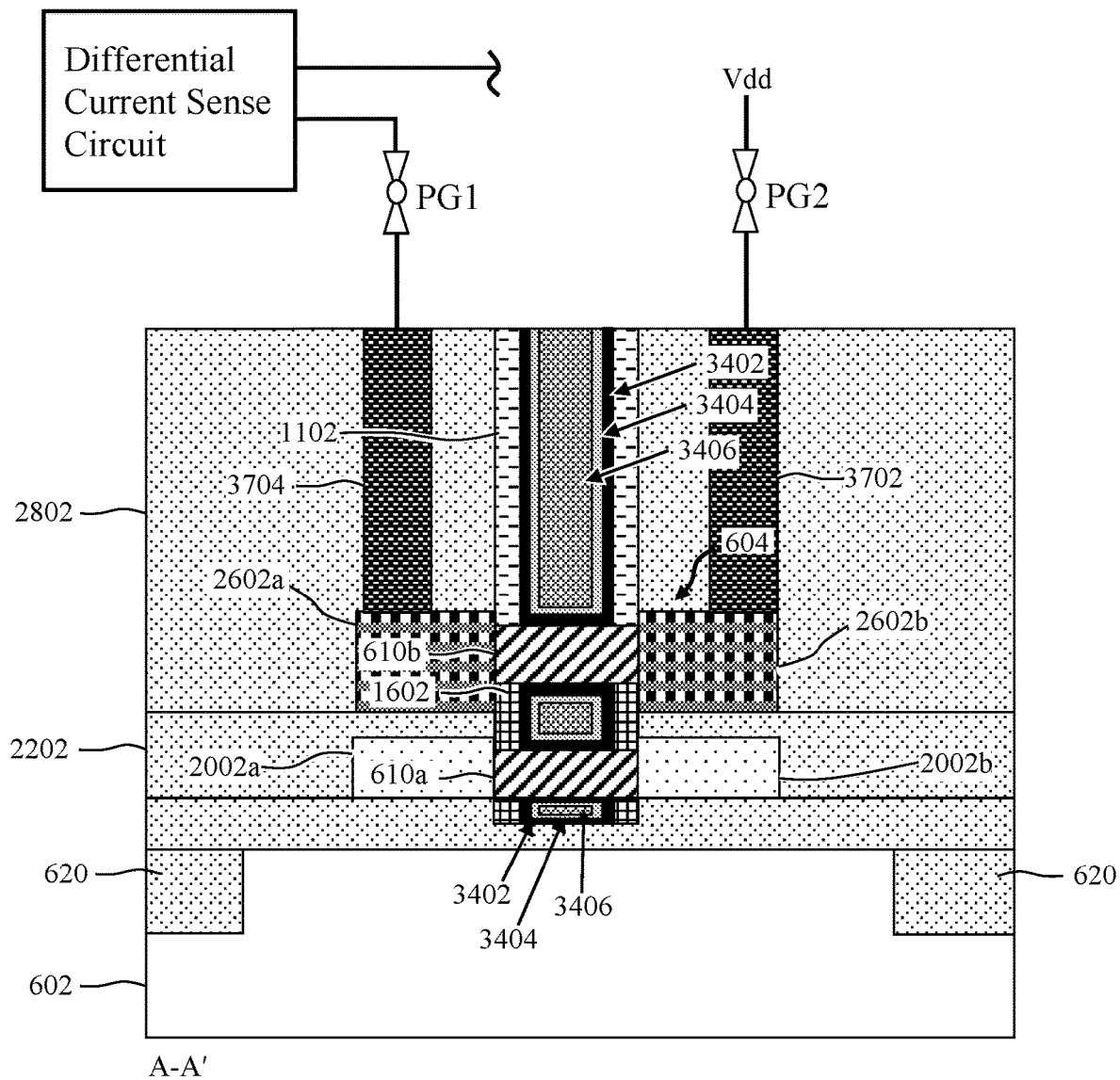
FIG. 37 is a cross-sectional diagram illustrating a view A-A' of the first contacts having been formed to the first/second top source/drain according to an embodiment of the present invention.
Figure 38A:
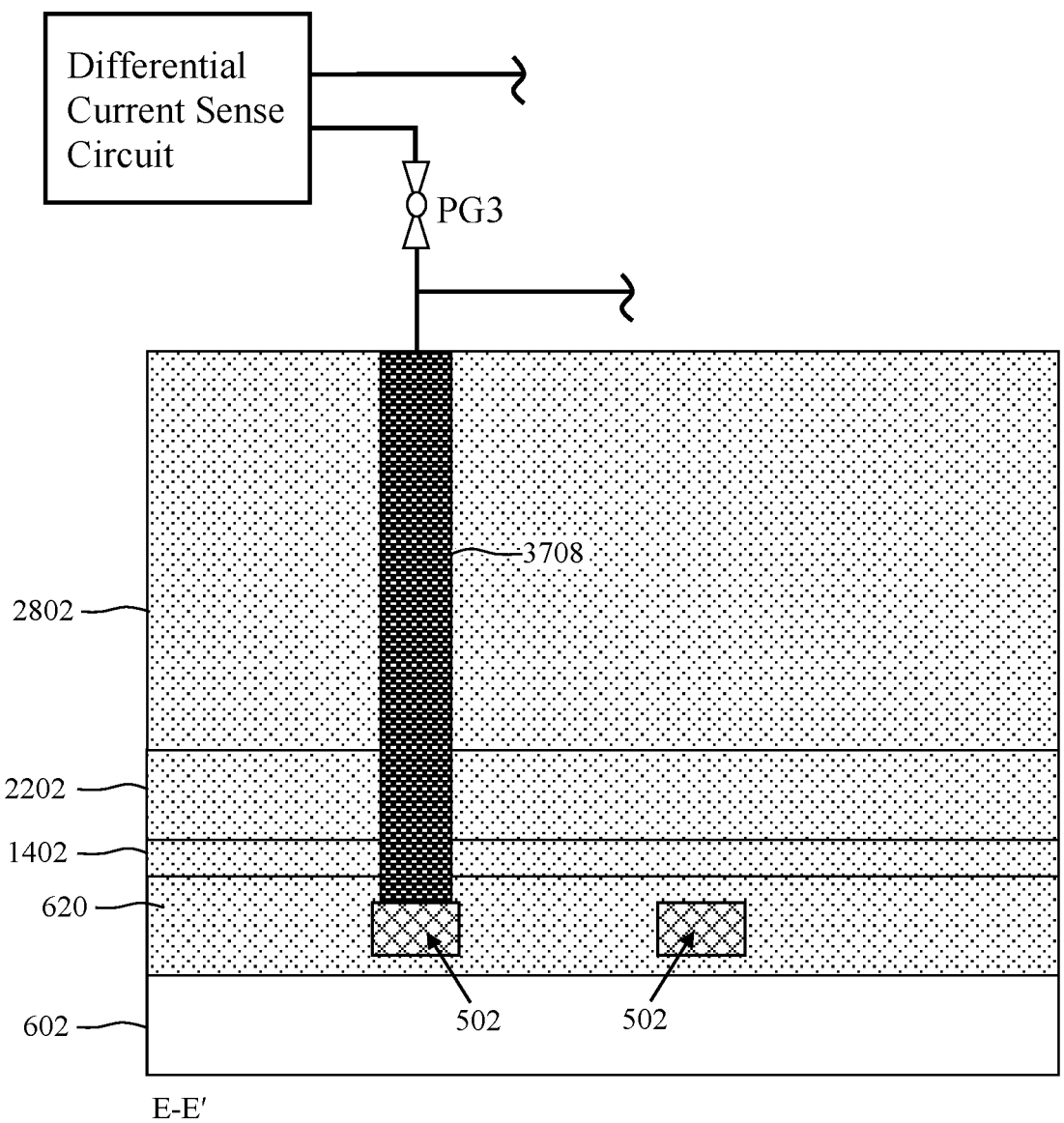
FIG. 38A is a cross-sectional diagram illustrating a view E-E' of one of the second contacts having been formed to the first bottom source/drain (via the power rails and a buried contact) according to an embodiment of the present invention.
Figure 38B:
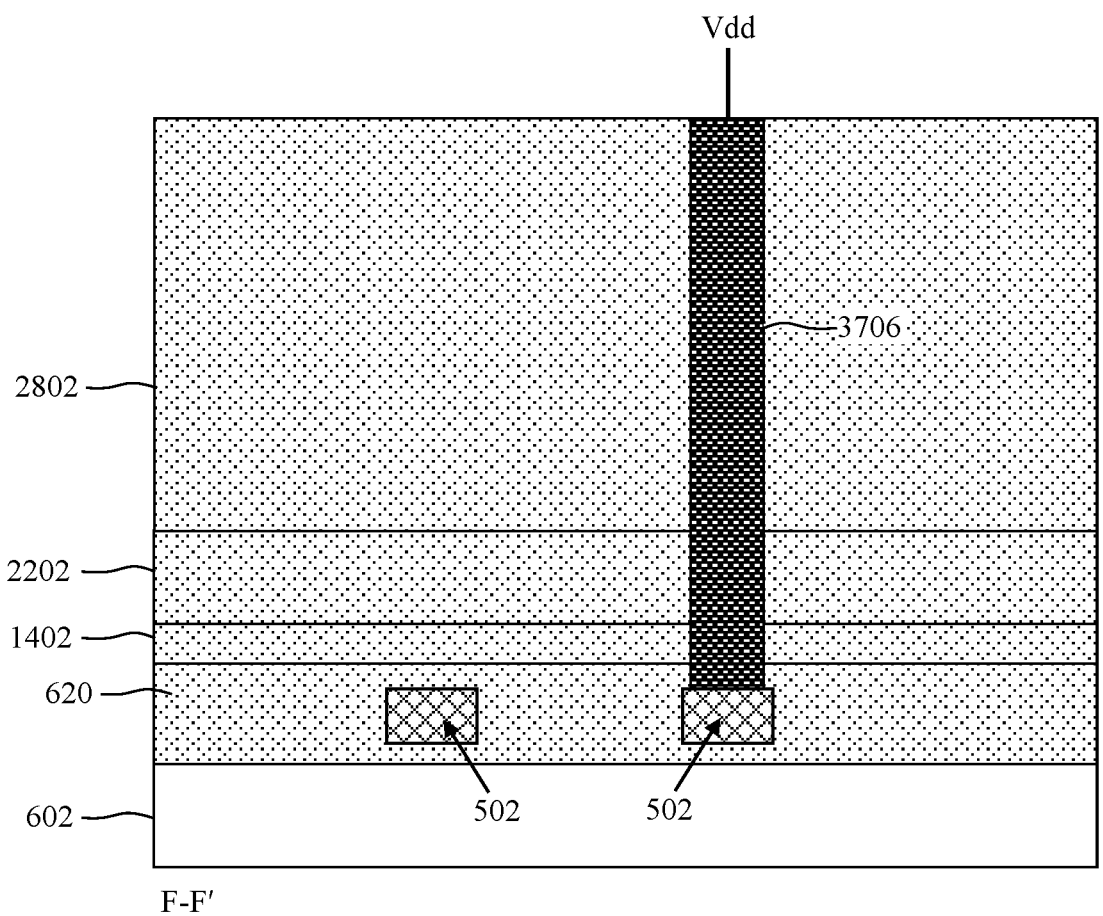
FIG. 38B is a cross-sectional diagram illustrating a view F-F' of another one of the second contacts having been formed to the second bottom source/drain (via the power rails and a buried contact) according to an embodiment of the present invention.

As shown in the cross-sectional view A-A', depicted in FIG. 37, contacts 3704 and 3702 connect the source/drain 2602a and source/drain 2602b of the top FET (in this case the reference transistor) to the differential current sense circuit and to Vdd via first/second pass gates PG1 and PG2, respectively. As shown in the cross-sectional view E-E' depicted in FIG. 38A, contact 3708 connects the source/drain 2002a (via power rails 502 and buried contact 2402a) of the bottom FET (in this case the stressed transistor) to the differential current sense circuit via third pass gate PG3. Referring to FIG. 36 (described above), contact 3708 also connects the source/drain 2002a of the bottom FET to GND via fourth pass gate PG4. As shown in the cross-sectional view F-F' depicted in FIG. 38B, contact 3706 connects the source/drain 2002b (via power rails 502 and buried contact 2402b) of the bottom FET (in this case the stressed transistor) to Vdd.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A usage metering device, comprising:
   at least one metering circuit on a chip, the at least one metering circuit comprising a pair of matching transistors, and a differential current sense circuit connected to the pair of matching transistors,
   wherein the pair of matching transistors comprises a reference transistor which is unused during regular operation of the chip, and a stressed transistor that is on continuously during the regular operation of the chip, and wherein the differential current sense circuit determines a threshold voltage (Vt) difference between the reference transistor and the stressed transistor.

2. The usage metering device of claim 1, further comprising:
   a plurality of metering circuits on the chip, wherein each of the metering circuits comprises the pair of matching transistors and the differential current sense circuit connected to the pair of matching transistors.

3. The usage metering device of claim 1, further comprising:
   pass gates connecting the reference transistor and the stressed transistor to the differential current sense circuit.

4. The usage metering device of claim 1, further comprising:
   a first pass gate (PG1) connecting the reference transistor to the differential current sense circuit;
   a second pass gate (PG2) connecting the reference transistor to an applied voltage (Vdd);
   a third pass gate (PG3) connecting the stressed transistor to the differential current sense circuit; and
   a fourth pass gate (PG4) connecting the stressed transistor to a ground (GND).

5. The usage metering device of claim 4, further comprising:
   a stacked field-effect transistor (FET) device comprising the pair of matching transistors.

6. The usage metering device of claim 5, wherein the stacked FET device comprises:
   at least a first active layer and a second active layer disposed, one on top of another, as a stack on a substrate, wherein the first active layer serves as a channel of a first FET and the second active layer serves as a channel of a second FET;

a first bottom source/drain and a second bottom source/drain at opposite ends of the first active layer;

a first top source/drain and a second top source/drain at each end of the second active layer; and a gate surrounding at least a portion of the first active layer and at least a portion of the second active layer, wherein either the reference transistor is the first FET if the stressed transistor is the second FET, or the reference transistor is the second FET if the stressed transistor is the first FET.

7. The usage metering device of claim 6, wherein the stacked FET device further comprises:

shallow trench isolation (STI) regions in the substrate at a base of the stack;

power rails buried in the STI regions; and buried contacts connecting the first bottom source/drain and the second bottom source/drain to the power rails.

8. The usage metering device of claim 7, further comprising:

first contacts to the first top source/drain and the second top source/drain;

second contacts to the first bottom source/drain and the second bottom source/drain; and a third contact to the gate.

9. The usage metering device of claim 8, wherein one of the first contacts is connected to the PG1 and another of the first contacts is connected to the PG2, and wherein one of the second contacts is connected to the PG3 and the PG4 and another of the second contacts is connected to the Vdd.

10. The usage metering device of claim 6, further comprising:

a bottom dielectric isolation layer disposed on the substrate;

the first bottom source/drain and the second bottom source/drain disposed on the bottom dielectric isolation layer;

a dielectric layer disposed on the bottom dielectric isolation layer covering the first bottom source/drain and the second bottom source/drain; and the first top source/drain and the second top source/drain disposed on the dielectric layer.

11. A method for usage metering, the method comprising:

providing a usage metering device including at least one metering circuit on a chip, the at least one metering circuit comprising a pair of matching transistors, and a differential current sense circuit connected to the pair of matching transistors, wherein the pair of matching transistors comprises a reference transistor which is unused during regular operation of the chip, and a stressed transistor that is on continuously during the regular operation of the chip; and determining a threshold voltage (Vt) difference between the reference transistor and the stressed transistor using the differential current sense circuit.

12. The method of claim 11, wherein the usage metering device further comprises:

a first pass gate (PG1) connecting the reference transistor to the differential current sense circuit;

a second pass gate (PG2) connecting the reference transistor to an applied voltage (Vdd);

a third pass gate (PG3) connecting the stressed transistor to the differential current sense circuit; and a fourth pass gate (PG4) connecting the stressed transistor to a ground (GND).

13. The method of claim 12, wherein during the regular operation of the chip the method further comprises:

switching off the PG1, the PG2 and the PG3 such that the reference transistor is not stressed; and switching on the PG4 such that a Vt of the stressed transistor increases over time.

14. The method of claim 12, wherein during a usage metering read out the method further comprises:

switching off the PG4 to block the stressed transistor from the GND;

switching on the PG1, the PG2 and the PG3 to connect the reference transistor to the Vdd, and to connect the reference transistor and the stressed transistor to the differential current sense circuit; and sensing a difference in current between the reference transistor and the stressed transistor using the differential current sense circuit.

15. The method of claim 14, wherein during a usage metering read out the method further comprises:

translating the difference in current between the reference transistor and the stressed transistor to an age of the chip.

16. A method of forming a usage metering device, the method comprising:

forming at least one metering circuit on a chip having a pair of matching transistors, wherein the pair of matching transistors comprises a reference transistor which is unused during regular operation of the chip, and a stressed transistor that is on continuously during the regular operation of the chip; and connecting the pair of matching transistors to a differential current sense circuit, wherein the differential current sense circuit determines a threshold voltage (Vt) difference between the reference transistor and the stressed transistor.

17. The method of claim 16, further comprising:

connecting the reference transistor to the differential current sense circuit via a first pass gate (PG1);

connecting the reference transistor to an applied voltage (Vdd) via a second pass gate (PG2);

connecting the stressed transistor to the differential current sense circuit via a third pass gate (PG3); and connecting the stressed transistor to a ground (GND) via a fourth pass gate (PG4).

18. The method of claim 17, wherein the pair of matching transistors comprises a stacked field-effect transistor (FET) device, and wherein the method further comprises:

forming alternating sacrificial layers and active layers as a stack on a substrate, wherein the active layers comprise at least a first active layer and a second active layer, and wherein the first active layer serves as a channel of a first FET and the second active layer serves as a channel of a second FET;

forming a sacrificial gate on the stack;

forming a first sacrificial spacer along sidewalls of the stack that covers the first active layer;

forming a second sacrificial spacer along sidewalls of the stack that covers the second active layer;

selectively removing the first sacrificial spacer and forming a first bottom source/drain and a second bottom source/drain at opposite ends of the first active layer;

selectively removing the second sacrificial spacer and forming a first top source/drain and a second top source/drain at opposite ends of the second active layer;

removing the sacrificial layers and the sacrificial gate; and forming a replacement gate surrounding at least a portion of the first active layer and at least a portion of the second active layer,
wherein either the reference transistor is the first FET if the stressed transistor is the second FET, or the reference transistor is the second FET if the stressed transistor is the first FET.

19. The method of claim 18, further comprising:
forming first contacts to the first top source/drain and the second top source/drain;
forming second contacts to the first bottom source/drain and the second bottom source/drain; and
forming a third contact to the gate.

20. The method of claim 19, further comprising:
connecting one of the first contacts to the PG1;
connecting another of the first contacts to the PG2;
connecting one of the second contacts to the PG3 and the PG4; and
connecting another of the second contacts to the Vdd.

* * * * *